United States Patent
Kubouchi

(10) Patent No.: US 12,087,827 B2
(45) Date of Patent: Sep. 10, 2024

(54) SEMICONDUCTOR DEVICE

(71) Applicant: FUJI ELECTRIC CO., LTD., Kanagawa (JP)

(72) Inventor: Motoyoshi Kubouchi, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 427 days.

(21) Appl. No.: 17/581,973

(22) Filed: Jan. 23, 2022

(65) Prior Publication Data
US 2022/0149159 A1    May 12, 2022

Related U.S. Application Data

(63) Continuation of application No. PCT/JP2021/006016, filed on Feb. 17, 2021.

(30) Foreign Application Priority Data

Feb. 18, 2020    (JP) .................................. 2020-025326

(51) Int. Cl.
*H01L 21/32*    (2006.01)
*H01L 21/324*    (2006.01)
(Continued)

(52) U.S. Cl.
CPC ............ *H01L 29/36* (2013.01); *H01L 21/324* (2013.01); *H01L 29/1095* (2013.01); *H01L 29/7393* (2013.01)

(58) Field of Classification Search
CPC ............................. H01L 29/36; H01L 21/324
See application file for complete search history.

(56) References Cited

U.S. PATENT DOCUMENTS 10,014,400 B2    7/2018    Oefner
2008/0315364 A1    12/2008    Nemoto
(Continued)

FOREIGN PATENT DOCUMENTS

JP    2004186620 A    7/2004
JP    2008177296 A    7/2008
(Continued)

OTHER PUBLICATIONS

Office Action issued for counterpart Japanese Application No. 2022-501951, issued by the Japanese Patent Office on Dec. 6, 2022 (drafted on Nov. 30, 2022).
(Continued)

*Primary Examiner* — Douglas M Menz

(57) ABSTRACT

Provided is a semiconductor device including: a semiconductor substrate having upper and lower surfaces and throughout which a first-conductivity-type bulk donor is distributed; a first-conductivity-type high concentration region including a center position in a depth direction of the substrate and having a donor concentration higher than a doping concentration of the donors; and an upper surface side oxygen reduction region provided in contact with the upper surface inside the substrate and in which an oxygen chemical concentration decreases as approaching the upper surface. The oxygen chemical concentration distribution may have a maximum value region where the oxygen chemical concentration is 50% or more of the maximum value, a first peak of an impurity chemical concentration may be arranged in an end of the high concentration region in the depth direction, and the peak may be arranged on the upper surface side with respect to or in the maximum value region.

25 Claims, 28 Drawing Sheets

(51) Int. Cl.
*H01L 29/10* (2006.01)
*H01L 29/36* (2006.01)
*H01L 29/739* (2006.01)

(56) References Cited

U.S. PATENT DOCUMENTS

| | | |
|---|---|---|
| 2011/0042791 A1 | 2/2011 | Schulze |
| 2013/0249058 A1 | 9/2013 | Neidhart |
| 2015/0050754 A1 | 2/2015 | Ploss |
| 2015/0126000 A1 | 5/2015 | Kakefu |
| 2015/0270132 A1 | 9/2015 | Laven |
| 2016/0141399 A1 | 5/2016 | Jelinek |
| 2017/0271447 A1 | 9/2017 | Tamura |
| 2018/0005829 A1 | 1/2018 | Takishita |
| 2018/0005831 A1 | 1/2018 | Schulze |
| 2018/0090564 A1 | 3/2018 | Wakagi |
| 2018/0090565 A1 | 3/2018 | Voss |
| 2018/0122895 A1 | 5/2018 | Jelinek |
| 2019/0043971 A1* | 2/2019 | Hölzl .................. H01L 29/0878 |
| 2019/0181219 A1 | 6/2019 | Mori |
| 2020/0098905 A1 | 3/2020 | Naito |
| 2020/0194562 A1 | 6/2020 | Yoshimura |
| 2021/0082702 A1 | 3/2021 | Agata |

FOREIGN PATENT DOCUMENTS

| | | |
|---|---|---|
| JP | 2011222550 A | 11/2011 |
| JP | 2013153183 A | 8/2013 |
| JP | 2015090953 A | 5/2015 |
| JP | 2016184713 A | 10/2016 |
| JP | 2018056220 A | 4/2018 |
| WO | 2007055352 A1 | 5/2007 |
| WO | 2016204227 A1 | 12/2016 |
| WO | 2017047276 A1 | 3/2017 |
| WO | 2018034250 A1 | 2/2018 |
| WO | 2019117248 A1 | 6/2019 |
| WO | 2019181852 A1 | 9/2019 |
| WO | 2020080295 A1 | 4/2020 |

OTHER PUBLICATIONS

International Search Report and (ISA/237) Written Opinion of the International Search Authority for International Patent Application No. PCT/JP2021/006016, mailed by the Japan Patent Office on May 25, 2021.

* cited by examiner

SEMICONDUCTOR DEVICE

The contents of the following Japanese and PCT patent applications are incorporated herein by reference:
No. 2020-025326 filed in JP on Feb. 18, 2020, and
No. PCT/JP2021/006016 filed in WO on Feb. 17, 2021.

BACKGROUND

1. Technical Field

The present invention relates to a semiconductor device.

2. Related Art

Conventionally, it is known that a semiconductor wafer is radiated with protons to perform a thermal process so as to "generate hydrogen induced donors from crystal defects formed by proton radiation and introduced proton" (see, for example, paragraph 0061 of Patent Document 1).
Patent Document 1: Japanese Patent Application Publication No. 2013-153183.

DESCRIPTION OF EXEMPLARY EMBODIMENTS

Figure 1:
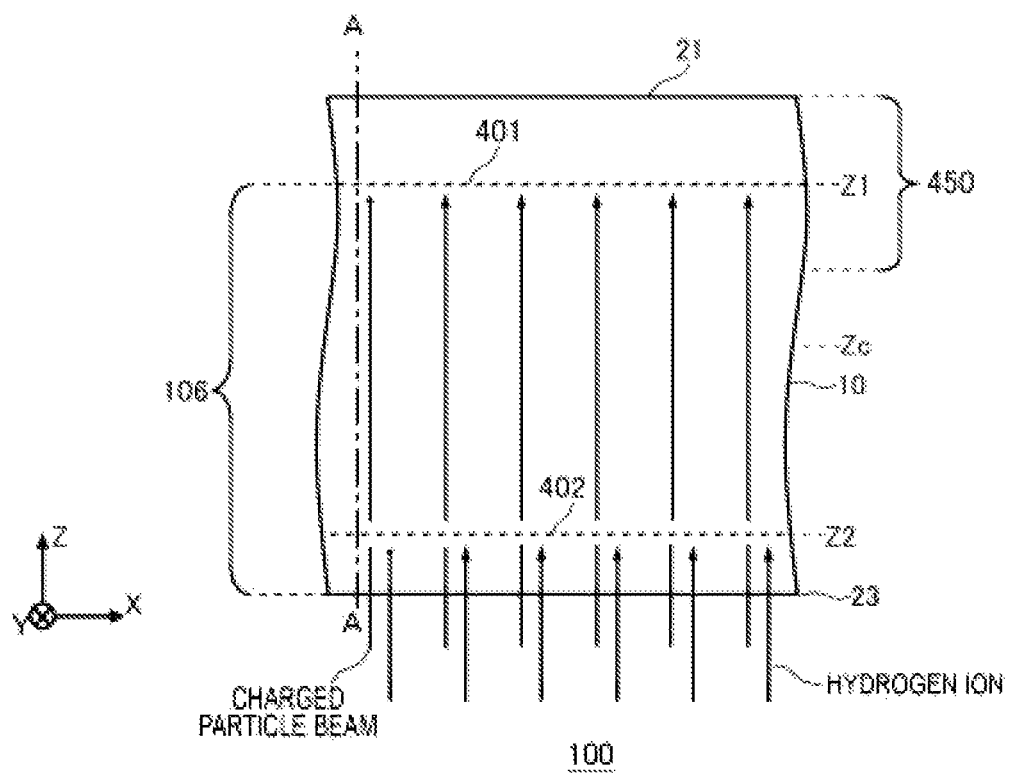
FIG. 1 illustrates a sectional view showing an example of a semiconductor device 100.

Hereinafter, the invention will be described through embodiments of the invention, but the following embodiments do not limit the invention according to claims. In addition, not all of the combinations of features described in the embodiments are essential to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction. In the case of referring to an upper surface side of the semiconductor substrate in the present specification, the upper surface side indicates a region from the center to the upper surface in the depth direction of the semiconductor substrate. In the case of referring to a lower surface side of the semiconductor substrate, the lower surface side indicates a region from the center to the lower surface in the depth direction of the semiconductor substrate.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D$-$N_A$.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons.

In the present specification, a description of a P+ type or an N+ type means a higher doping concentration than that of the P type or the N type, and a description of a P- type or an N-type means a lower doping concentration than that of the P type or the N type. Further, in the specification, a description of a P++ type or an N++ type means a higher doping concentration than that of the P+ type or the N+ type.

A chemical concentration in the present specification indicates an atomic density of an impurity measured regardless of an electrical activation state. The chemical concentration (atomic density) can be measured by, for example, secondary ion mass spectrometry (SIMS). The net doping concentration described above can be measured by voltage-capacitance profiling (CV profiling). Further, a carrier concentration measured by spreading resistance profiling (SRP method) may be set as the net doping concentration. The carrier concentration measured by the CV profiling or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 illustrates a sectional view showing an example of a semiconductor device 100. The semiconductor device 100 includes a semiconductor substrate 10. The semiconductor substrate 10 is a substrate that is formed of a semiconductor material. As an example, the semiconductor substrate 10 is a silicon substrate.

At least one of a transistor element such as an insulated gate bipolar transistor (IGBT) and a diode element such as a freewheeling diode (FWD) is formed on the semiconductor substrate 10. In FIG. 1, each electrode of the transistor device and the diode device and each region provided inside the semiconductor substrate 10, of the transistor element and the diode element are omitted.

In the semiconductor substrate 10 of the this example, bulk donors of an N type are distributed throughout. The bulk donor is a dopant donor substantially uniformly contained in an ingot during the manufacture of the ingot from which the semiconductor substrate 10 is made. The bulk donor of the this example is an element other than hydrogen. The bulk donor dopant is, for example, an element of Group V or Group VI, and is, for example, but not limited to, phosphorous, antimony, arsenic, selenium, or sulfur. The bulk donor of the this example is phosphorous. The bulk donor is also contained in the P type region. The semiconductor substrate 10 may be a wafer cut out from a semiconductor ingot, or may be a chip obtained by singulating the wafer. The semiconductor ingot may be manufactured by any one of a Czochralski method (CZ method), a magnetic field applied Czochralski method (MCZ method), and a float zone method (FZ method).

An oxygen chemical concentration contained in the substrate manufactured by the MCZ method is, for example, $1\times10^{17}$ to $7\times10^{17}$ atoms/cm$^3$. The oxygen chemical concentration contained in the substrate manufactured by the FZ method is, for example, $1\times10^{15}$ to $5\times10^{16}$ atoms/cm$^3$. The bulk donor concentration may use a chemical concentration of bulk donors distributed throughout the semiconductor substrate 10, and may be a value between 90% and 100% of the chemical concentration. In the semiconductor substrate doped with dopants of groups V and VI such as phosphorous, the bulk donor concentration may be $1\times10^{11}$/cm$^3$ or more and $3\times10^{13}$/cm$^3$ or less. The bulk donor concentration of the semiconductor substrate doped with the dopants of groups V and VI is preferably $1\times10^{12}$/cm$^3$ or more and $1\times10^{13}/cm^3$ or less. As the semiconductor substrate 10, a non-doped substrate substantially not containing a bulk dopant such as phosphorous may be used. In that case, the bulk donor concentration ($N_{B0}$) of the non-doped substrate is, for example, $1\times10^{10}/cm^3$ or more and $5\times10^{12}/cm^3$ or less. The bulk donor concentration ($N_{B0}$) of the non-doped substrate is preferably $1\times10^{11}/cm^3$ or more. The bulk donor concentration ($N_{B0}$) of the non-doped substrate is preferably $5\times10^{12}/cm^3$ or less.

The semiconductor substrate 10 has an upper surface 21 and a lower surface 23. The upper surface 21 and the lower surface 23 are two principal surfaces of the semiconductor substrate 10. In the specification, orthogonal axes in the plane that is parallel to the upper surface 21 and the lower surface 23 is referred to as an x axis and a y axis, and the perpendicular axis to the upper surface 21 and the lower surface 23 is referred to as a z axis.

A charged particle beam is implanted from the lower surface 23 into the semiconductor substrate 10 at a predetermined depth position Z1. The principal surface of the semiconductor substrate 10 into which the charged particle beam is implanted may not be limited to the lower surface 23 and may be the upper surface 21. In the present specification, the distance from the upper surface 21 in the Z axis direction may be referred to as a depth position. In the present specification, the center position in the depth direction of the semiconductor substrate 10 is defined as a depth position Zc. The depth position Z1 is a position where the distance from the upper surface 21 in the Z axis direction is Z1. The depth position Z1 is arranged on the upper surface 21 side of the semiconductor substrate 10 (a region between the depth position Zc and the upper surface 21). Implantation of the charged particle beam into the depth position Z1 means that an average distance (also referred to as a range) of charged particles passing through the inside of the semiconductor substrate 10 is Z1. The charged particles are accelerated by acceleration energy corresponding to the predetermined depth position Z1 and introduced into the semiconductor substrate 10.

A region where the charged particles have passed through the inside of the semiconductor substrate 10 is defined as a pass-through region 106. In the example of FIG. 1, a region from the lower surface 23 of the semiconductor substrate 10 to the depth position Z1 is the pass-through region 106. The charged particles are particles capable of forming lattice defects in the pass-through region 106. The charged particles are, for example, hydrogen ions, helium ions, or electrons. The charged particles may be implanted into the entire surface of the semiconductor substrate 10 in the XY plane, or may be implanted into only a partial region.

The semiconductor substrate 10 has a first peak 401 of the charged particle concentration at the depth position Z1. In the this example, the charged particles are hydrogen. That is, the semiconductor substrate 10 of the this example has the first peak 401 in the depth direction of the hydrogen chemical concentration at the depth position Z1. The first peak 401 may be a peak in the helium chemical concentration distribution.

In the pass-through region 106 through which the charged particles have passed in the semiconductor substrate 10, lattice defects mainly composed of vacancies such as monatomic vacancies (V) and diatomic vacancies (VV) are formed by the charged particles passing therethrough. Atoms adjacent to the vacancies have dangling bonds. Lattice defects also include interstitial atoms, dislocations, and the like, and may include donors and acceptors in a broad sense. However, in the present specification, lattice defects mainly composed of vacancies may be referred to as vacancy-type lattice defects, vacancy-type defects, or simply lattice defects. In addition, since many lattice defects are formed by implantation of charged particles into the semiconductor substrate 10, the crystallinity of the semiconductor substrate 10 may be strongly disturbed. In the present specification, this disturbance of crystallinity may be referred to as disorder.

In addition, oxygen is contained in the entire semiconductor substrate 10. The oxygen is introduced intentionally or unintentionally during manufacturing a semiconductor ingot. Hydrogen is contained in at least a partial region of the pass-through region 106. The hydrogen may be intentionally implanted into the semiconductor substrate 10.

In the this example, hydrogen ions are implanted into a depth position Z2 from the lower surface 23. The hydrogen ions of the this example are protons. The principal surface of the semiconductor substrate 10 into which hydrogen ions are implanted may not be limited to the lower surface 23 and may be the upper surface 21. The semiconductor substrate 10 of the this example has a second peak 402 of hydrogen chemical concentration at the depth position Z2. In FIG. 1, the first peak 401 and the second peak 402 are schematically indicated by broken lines. The depth position Z2 may be included in the pass-through region 106. The depth position Z2 of the this example is arranged on the lower surface 23 side of the semiconductor substrate 10 (a region between the depth position Zc and the lower surface 23). Note that hydrogen implanted at the depth position Z1 may be diffused into the pass-through region 106, or hydrogen may be introduced into the pass-through region 106 by another method. In these cases, hydrogen ions may not be implanted into the depth position Z2.

After the pass-through region 106 is formed in the semiconductor substrate 10 and hydrogen ions are implanted into the semiconductor substrate 10, hydrogen (H), vacancies (V), and oxygen (O) are combined inside the semiconductor substrate 10, and VOH defects are formed. In addition, heat treatment (sometimes referred to as annealing in the present specification) of the semiconductor substrate 10 diffuses hydrogen to promote formation of VOH defects. In addition, since hydrogen can be combined to the vacancies by heat treatment after forming the pass-through region 106, it is possible to suppress release of hydrogen to the outside of the semiconductor substrate 10.

The VOH defect functions as a donor that supplies electrons. In the present specification, VOH defects may be referred to simply as hydrogen donors. In the semiconductor substrate 10 of the this example, a hydrogen donor is formed in the pass-through region 106. The doping concentration of the hydrogen donor at each position is lower than the chemical concentration of hydrogen at each position. Regarding the chemical concentration of hydrogen, the ratio of the chemical concentration of hydrogen to the doping concentration of hydrogen donors (VOH defects) may be a value between 0.1% and 30% (that is, 0.001 or more and 0.3 or less). In the this example, the ratio of the chemical concentration of hydrogen to the doping concentration of hydrogen donors (VOH defects) is 1% to 5%. Note that, unless otherwise specified, in the present specification, VOH defects having a distribution similar to the chemical concentration distribution of hydrogen and VOH defects similar to the distribution of vacancy defects in the pass-through region 106 are also referred to as hydrogen donors or hydrogen as donors.

By forming a hydrogen donor in the pass-through region 106 of the semiconductor substrate 10, the donor concentration in the pass-through region 106 can be made higher than the doping concentration of the bulk donor (also referred to simply as bulk donor concentration) of the bulk donor. Normally, it is necessary to prepare the semiconductor substrate 10 having a predetermined bulk donor concentration in accordance with characteristics of an element to be formed on the semiconductor substrate 10, particularly a rated voltage or a breakdown voltage. On the other hand, according to the semiconductor device 100 illustrated in FIG. 1, the donor concentration of the semiconductor substrate 10 can be adjusted by controlling the dosing amount of charged particles. Therefore, the semiconductor device 100 can be manufactured using a semiconductor substrate having a bulk donor concentration that does not correspond to the characteristics and the like of the element. The variation in the bulk donor concentration during manufacturing the semiconductor substrate 10 is relatively large, but the dosing amount of the charged particles can be controlled with relatively high precision. Therefore, the concentration of lattice defects generated by implanted charged particles can also be controlled with high precision, and the donor concentration in the pass-through region can be controlled with high precision.

The depth position Z1 may be arranged in a range of half or less of the thickness of the semiconductor substrate 10 with respect to the upper surface 21, or may be arranged in a range of ¼ or less of the thickness of the semiconductor substrate 10. The depth position Z2 may be arranged in a range of half or less of the thickness of the semiconductor substrate 10 with respect to the lower surface 23, or may be arranged in a range of ¼ or less of the thickness of the semiconductor substrate 10. However, the depth position Z1 and the depth position Z2 are not limited to these ranges.

The semiconductor substrate 10 has an upper surface side oxygen reduction region 450. The upper surface side oxygen reduction region 450 is a region inside the semiconductor substrate 10 and is a region in contact with the upper surface 21 of the semiconductor substrate 10. The upper surface side oxygen reduction region 450 is a region where the oxygen chemical concentration decreases as the depth position approaches the upper surface 21. The upper surface side oxygen reduction region 450 may be a region where the oxygen chemical concentration decreases over a length of 3% or more of the substrate thickness of the semiconductor substrate 10, a region where the oxygen chemical concentration decreases over a length of 5% or more of the substrate thickness, or a region where the oxygen chemical concentration decreases over a length of 10% or more of the substrate thickness. The substrate thickness refers to the thickness of the semiconductor substrate 10 in the depth direction.

In a semiconductor ingot or a wafer cut out from the ingot, oxygen having a approximately uniform concentration is contained in the entire substrate. However, the variation in oxygen chemical concentration between the substrates is relatively large. When the oxygen chemical concentration varies, the concentration of VOH defects formed by implanted hydrogen tends to vary.

In the this example, the semiconductor substrate 10 is annealed at a predetermined annealing temperature and a predetermined annealing time. The semiconductor substrate 10 may be annealed in a state of a wafer cut out from an ingot, or may be annealed in a state of a chip cut out from a wafer. The annealing is preferably performed before the implantation of the charged particle beam. In the present specification, the annealing before the implantation of the charged particle beam may be referred to as oxygen annealing.

At the time of oxygen annealing, the surface of the semiconductor substrate 10 may be exposed to an oxygen-containing atmosphere or an oxide film may be formed. The oxygen annealing time is long enough to introduce oxygen having a concentration of a solid solubility limit corresponding to the oxygen annealing temperature into the substrate. The oxygen annealing time may be 1 hour or more, 2 hours or more, or 10 hours or more. The solid solubility limit of oxygen refers to a limit concentration of oxygen that can be dissolved in the substrate, and varies depending on the oxygen annealing temperature. The oxygen annealing temperature is, for example, 1000° C. or higher, but is not limited thereto. The oxygen annealing temperature may be set so that the solid solubility limit of oxygen is sufficiently higher than the oxygen chemical concentration of the semiconductor substrate 10 before oxygen annealing.

By performing oxygen annealing with an oxygen annealing time equal to or longer than a certain value, oxygen having a chemical concentration approximately matching the solid solubility limit is introduced into the semiconductor substrate 10. Therefore, the oxygen chemical concentration of the semiconductor substrate 10 can be controlled by managing the oxygen annealing temperature so as to have a solid solubility limit corresponding to a desired oxygen chemical concentration. In addition, since the oxygen annealing temperature can be managed relatively easily, variation in oxygen chemical concentration between the substrates can also be reduced.

In the process of taking out the semiconductor substrate 10 from the oxygen atmosphere and returning the temperature from the oxygen annealing temperature to room temperature, oxygen in the vicinity of the surface of the semiconductor substrate 10 diffuses out of the substrate (referred to as outward diffusion in the present specification). The outward diffusion is more likely to occur as it is closer to the surface of the semiconductor substrate 10. Therefore, the upper surface side oxygen reduction region 450 is formed in the semiconductor substrate 10. Note that a lower surface side oxygen reduction region is also formed in a region in contact with the lower surface 23 of the semiconductor substrate 10. However, in a case where the lower surface 23 side of the semiconductor substrate 10 is ground, the lower surface side oxygen reduction region may not remain.

Such processing can reduce variations in oxygen chemical concentration in the semiconductor substrate 10. Therefore, the concentration of VOH defects can be easily controlled, and the donor concentration of the semiconductor substrate 10 can be easily controlled.

Figure 2:
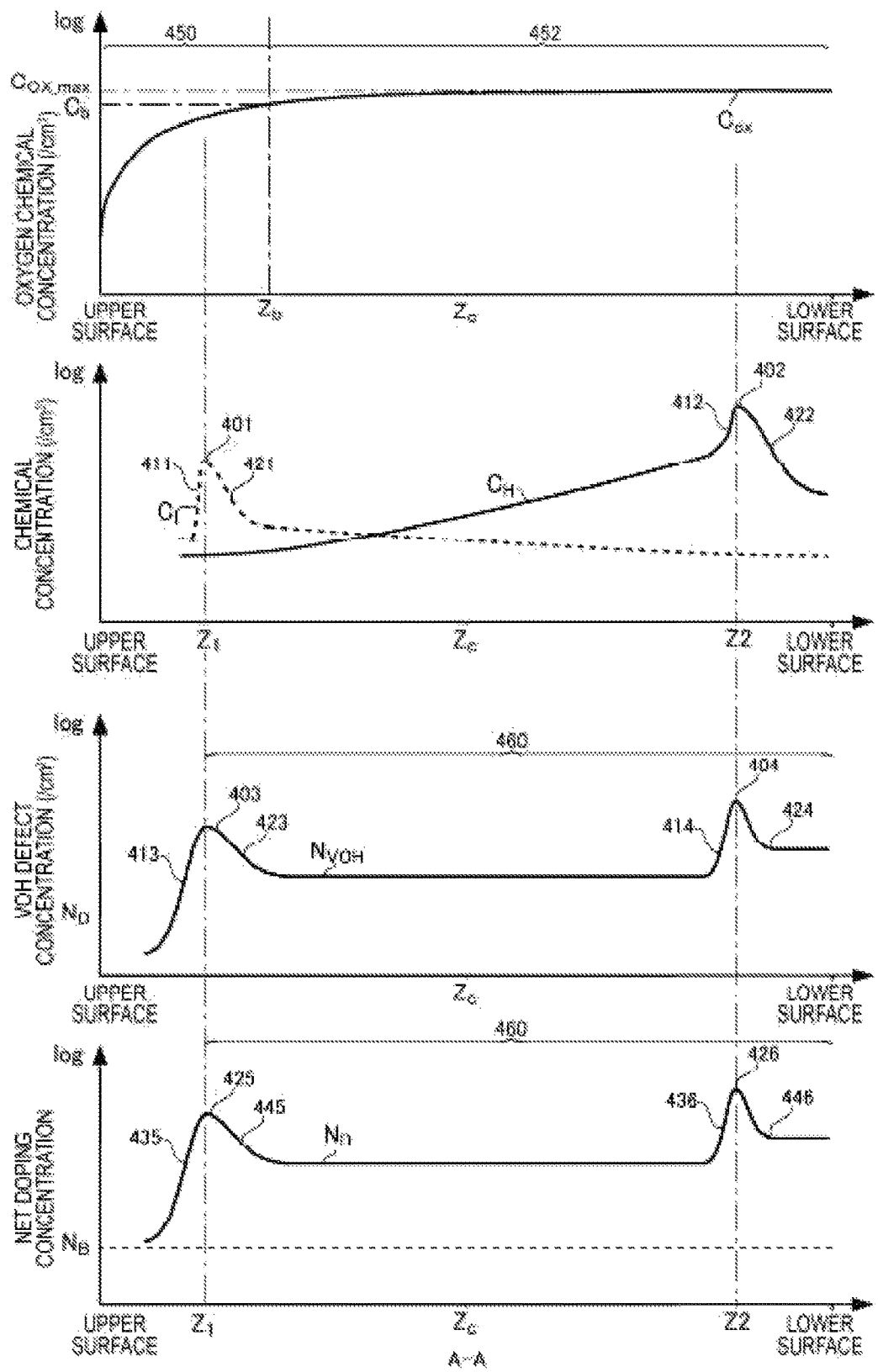
FIG. 2 illustrates a distribution example of an oxygen chemical concentration $C_{OX}$, an impurity chemical concentration $C_I$, a hydrogen chemical concentration $C_H$, and a VOH defect concentration $N_{VOH}$ in a depth direction at a position indicated by line A-A in FIG. 1.

FIG. 2 illustrates a distribution example of an oxygen chemical concentration $C_{OX}$, an impurity chemical concentration $C_I$, a hydrogen chemical concentration $C_H$, a VOH defect concentration $N_{VOH}$, and a net doping concentration $N_D$ in the depth direction at the position indicated by the line A-A in FIG. 1. FIG. 2 illustrates each distribution after oxygen annealing and hydrogen annealing after hydrogen implantation.

In FIG. 2, the horizontal axis represents the depth position from the upper surface 21, and the vertical axis represents each concentration per unit volume on a logarithmic axis. The chemical concentration in FIG. 2 is measured by, for example, a SIMS method. In FIG. 2, a bulk donor concentration $N_B$ is indicated by a broken line. The bulk donor concentration $N_B$ may be uniform throughout the semiconductor substrate 10. The semiconductor substrate 10 of the this example is an MCZ substrate as an example.

The distribution of the oxygen chemical concentration $C_{OX}$ has the upper surface side oxygen reduction region 450. As described above, oxygen in the vicinity of the upper surface 21 is diffused outward by performing oxygen annealing. In the this example, the lower surface 23 side of the semiconductor substrate 10 is ground after oxygen annealing. Therefore, the lower surface side oxygen reduction region is not provided on the lower surface 23 of the semiconductor substrate 10.

In the upper surface side oxygen reduction region 450, the reduction rate of the oxygen chemical concentration with respect to the unit distance in the depth direction may increase toward the upper surface 21. That is, the oxygen chemical concentration may decrease more steeply toward the upper surface 21.

The distribution of the oxygen chemical concentrations $C_{OX}$ has a maximum value region 452. The maximum value region 452 is a region including a position where the oxygen chemical concentration $C_{OX}$ becomes a maximum value $C_{OX\_max}$ in the depth direction and is a region where the oxygen chemical concentration $C_{OX}$ is equal to or more than a predetermined boundary concentration $C_b$. The boundary concentration $C_b$ may be 50%, 70%, 80% or more, 90% or more, or 100% of the maximum value $C_{OX\_max}$. The upper surface side oxygen reduction region 450 of the this example is arranged between the maximum value region 452 and the upper surface 21. A depth position of a boundary between the upper surface side oxygen reduction region 450 and the maximum value region 452 is defined as Zb. The maximum value region 452 of the this example is provided from the depth position Zb to the lower surface 23.

The maximum value $C_{OX\_max}$ may be $3 \times 10^{15}$ atoms/cm$^3$ or more and $2 \times 10^{18}$ atoms/cm$^3$ or less. The maximum value $C_{OX\_max}$ may be $1 \times 10^{16}$ atoms/cm$^3$ or more, or $1 \times 10^{17}$ atoms/cm$^3$ or more. The maximum value $C_{OX\_max}$ may be $1 \times 10^{18}$ atoms/cm$^3$ or less, or $1 \times 10^{17}$ atoms/cm$^3$ or less.

The impurity chemical concentration $C_I$ has a first peak 401 at the depth position Z1. In the this example, the impurity is hydrogen. The distribution of the impurity chemical concentration $C_I$ has an upper tail 411 in which the impurity chemical concentration $C_I$ decreases from the first peak 401 toward the upper surface 21, and a lower tail 421 in which the impurity chemical concentration $C_I$ decreases from the first peak 401 toward the lower surface 23. As described in FIG. 1, impurities (hydrogen in the this example) are implanted into the depth position Z1 from the lower surface 23. Therefore, the impurity chemical concentration $C_I$ of the upper tail 411 may decrease more steeply than that of the lower tail 421. The lower tail 421 may be provided from the first peak 401 to the lower surface 23. The impurity chemical concentration $C_I$ may be a chemical concentration of hydrogen implanted into the depth position Z1 from the lower surface 23 of the semiconductor substrate 10. The first peak 401 may be arranged in the upper surface side oxygen reduction region 450. The depth position Z1 of the first peak 401 may be arranged closer to the upper surface 21 than the depth position Zc. The depth position Z1 of the first peak 401 may be arranged closer to the upper surface 21 than the depth position $Z_b$.

A hydrogen chemical concentration $C_H$ of the this example has a second peak 402 arranged at the depth position Z2 between the first peak 401 and the lower surface 23. The second peak 402 of the this example is arranged in the maximum value region 452. The value of the chemical concentration of the second peak 402 may be larger than the value of the chemical concentration of the first peak 401. This facilitates the diffusion of hydrogen into the pass-through region 106. The value of the second peak 402 may be 2 times or more, 5 times or more, 10 times or more, or 100 times or more of the value of the first peak 401.

The distribution of the hydrogen chemical concentration $C_H$ has an upper tail 412 in which the hydrogen chemical concentration $C_H$ decreases from the second peak 402 toward the upper surface 21, and a lower tail 422 in which the hydrogen chemical concentration $C_H$ decreases from the second peak 402 toward the lower surface 23. As described in FIG. 1, hydrogen ions are implanted from the lower surface 23 to the depth position Z2. Therefore, the hydrogen chemical concentration $C_H$ of the upper tail 412 may decrease more steeply than that of the lower tail 422. However, since hydrogen diffuses from the second peak 402 toward the first peak 401 by heat-treating the semiconductor substrate 10, the upper tail 412 may have a portion gentler than the lower tail 422. At each position between the first peak 401 and the second peak 402, hydrogen having a chemical concentration of 10 times or more of the bulk donor concentration $N_B$ may exist, hydrogen having a chemical concentration of 100 times or more of the bulk donor concentration $N_B$ may exist, or hydrogen having a chemical concentration of 200 times or more of the bulk donor concentration $N_B$ may exist.

The distribution of the VOH defect concentration $N_{VOH}$ of the this example has the third peak 403 at the depth position Z1. At the depth position Z1, many vacancy defects are formed by the implantation of the charged particle beam. Therefore, many VOH defects are likely to be formed at the depth position Z1. The distribution of the VOH defect concentration $N_{VOH}$ of the this example has a fourth peak 404 at the depth position Z2. Many vacancy defects due to the implantation of hydrogen ions are formed at the depth position Z2. Therefore, many VOH defects are likely to be formed at the depth position Z2.

The distribution of the VOH defect concentration $N_{VOH}$ has an upper tail 413 in which the VOH defect concentration $N_{VOH}$ decreases from the third peak 403 toward the upper surface 21 and a lower tail 423 in which the VOH defect concentration $N_{VOH}$ decreases from the third peak 403 toward the lower surface 23. The VOH defect concentration $N_{VOH}$ of the upper tail 413 may decrease more steeply than that of the lower tail 423.

The distribution of the VOH defect concentration $N_{VOH}$ has an upper tail 414 in which the VOH defect concentration $N_{VOH}$ decreases from the fourth peak 404 toward the upper surface 21 and a lower tail 424 in which the VOH defect concentration $N_{VOH}$ decreases from the fourth peak 404 toward the lower surface 23. The VOH defect concentration $N_{VOH}$ of the upper tail 414 may decrease more steeply than that of the lower tail 424.

The net doping concentration $N_D$ of the this example has a concentration obtained by adding the bulk donor concentration $N_B$ and the VOH defect concentration $N_{VOH}$. Since the bulk donor concentration $N_B$ is approximately constant throughout the semiconductor substrate 10, the shape of the distribution of the net doping concentration $N_D$ is similar to the shape of the distribution of the VOH defect concentration $N_{VOH}$.

The distribution of the net doping concentration $N_D$ of the this example has a fifth peak 425 at the depth position Z1. In addition, the distribution of the net doping concentration $N_D$ of the this example has a sixth peak 426 at the depth position Z2. The distribution of the net doping concentration $N_D$ has an upper tail 435 in which the net doping concentration $N_D$ decreases from the fifth peak 425 toward the upper surface 21 and a lower tail 445 in which the net doping concentration $N_D$ decreases from the fifth peak 425 toward the lower surface 23. The net doping concentration $N_D$ of the upper tail 435 may decrease more steeply than that of the lower tail 445.

The distribution of the net doping concentration $N_D$ has an upper tail 436 in which the net doping concentration $N_D$ decreases from the sixth peak 426 toward the upper surface 21 and a lower tail 446 in which the net doping concentration $N_D$ decreases from the sixth peak 426 toward the lower surface 23. The net doping concentration $N_D$ of the upper tail 436 may decrease more steeply than that of the lower tail 446.

Note that the positions of the vertexes of the first peak 401, the third peak 403, and the fifth peak 425 may not strictly coincide with each other. Similarly, the positions of the vertexes of the second peak 402, the fourth peak 404, and the sixth peak 426 may not strictly coincide with each other. If the vertex of the other peak is arranged within the full width at half maximum of one peak, the two peaks may be provided at the same position.

Since VOH defects are formed in the pass-through region 106, the donor concentration in the pass-through region 106 is higher than the bulk donor concentration $N_B$. In the present specification, a region containing VOH defects and having a donor concentration higher than the bulk donor concentration $N_B$ is referred to as a high concentration region 460. The high concentration region 460 includes the depth position Zc of the semiconductor substrate 10 and is provided over a predetermined length in the depth direction. The length of the high concentration region 460 in the depth direction may be 50% or more, 60% or more, 70% or more, 80% or more, or 90% or more of the substrate thickness. The high concentration region 460 of the this example is provided from the first peak 401 to the lower surface 23.

In addition, the high concentration region 460 may also be provided above the first peak 401. The first peak 401 has a predetermined half-value width in the depth direction. Therefore, vacancy defects are also formed above the first peak 401, and the high concentration region 460 is formed. However, the high concentration region 460 above the first peak 401 has a smaller width in the depth direction than the high concentration region 460 below the first peak 401.

The high concentration region 460 may be a region where the VOH defect concentration $N_{VOH}$ is higher than the bulk donor concentration $N_B$. As a result, even in a case where the bulk donor concentration $N_B$ varies, the variation in donor concentration can be suppressed by the VOH defect concentration $N_{VOH}$ that can be controlled with high precision. The VOH defect concentration $N_{VOH}$ may be 2 times or more, 5 times or more, or 10 times or more of the bulk donor concentration $N_B$.

As illustrated in FIG. 2, the first peak 401 is arranged at an end portion of the high concentration region 460 on the upper surface 21 side. The first peak 401 may be arranged in the maximum value region 452 or on the upper surface 21 side with respect to the maximum value region 452. The first peak 401 of the this example is arranged in the upper surface side oxygen reduction region 450. As a result, the high concentration region 460 can be formed in a wider range in the depth direction. Therefore, the donor concentration of the semiconductor substrate 10 can be controlled with high precision in a wider range.

The first peak 401 may be arranged in a region where the oxygen chemical concentration $C_{OX}$ is 10% or more, 30% or more, 50% or more, 70% or more, or 90% or more of the maximum value $C_{OX\_max}$. If the oxygen chemical concentration $C_{OX}$ is small, the variation of the oxygen chemical concentration $C_{OX}$ with respect to the positional deviation in the depth direction increases. By arranging the first peak 401 in the region where the oxygen chemical concentration $C_{OX}$ is equal to or more than a predetermined value, it is possible to suppress the variation in the size of the third peak 403 in a case where the depth position of the first peak 401 is shifted. Therefore, variations in characteristics of the semiconductor device 100 can be suppressed.

Figure 3:
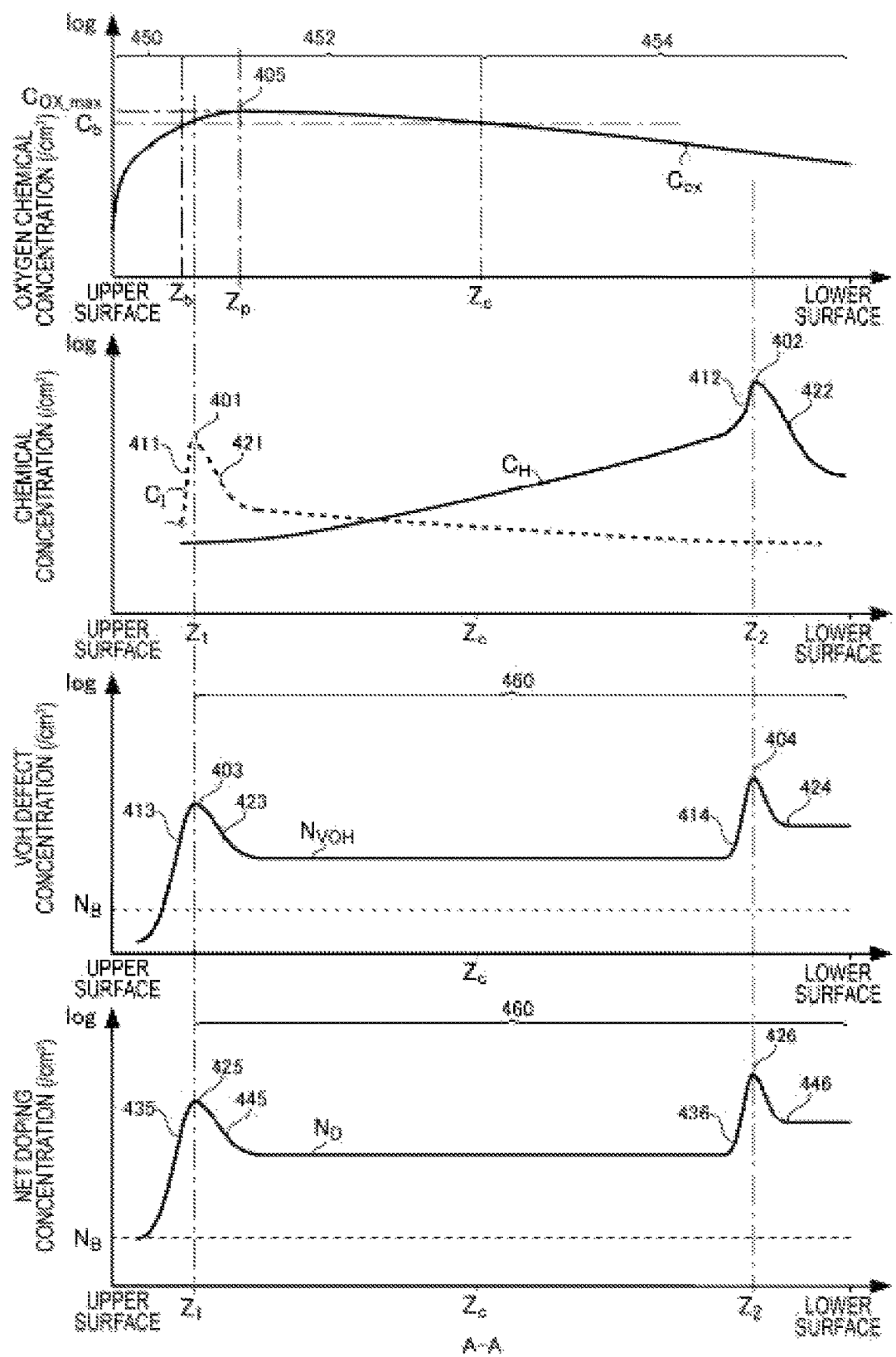
FIG. 3 illustrates another distribution example of the oxygen chemical concentration $C_{OX}$, the impurity chemical concentration $C_I$, the hydrogen chemical concentration $C_H$, and the VOH defect concentration $N_{VOH}$ in the depth direction at the position indicated by the line A-A in FIG. 1.

FIG. 3 illustrates another distribution example in the depth direction of the oxygen chemical concentration $C_{OX}$, the impurity chemical concentration $C_I$, the hydrogen chemical concentration $C_H$, the VOH defect concentration $N_{VOH}$, and the net doping concentration $N_D$ at the position indicated by the line A-A in FIG. 1. FIG. 3 illustrates each distribution after the heat treatment. In the this example, the oxygen chemical concentration $C_{OX}$ is different from that in the example of FIG. 2. The other concentration distributions are similar to those in the example of FIG. 2. The semiconductor substrate 10 of the this example is, for example, an FZ substrate.

The oxygen chemical concentration $C_{OX}$ of the this example has an oxygen concentration peak 405 indicating the local maximum value $C_0$ at a depth position $Z_p$. The range of the local maximum value $C_{OX\_max}$ may be similar to the range of the maximum value $C_{OX\_max}$ in FIG. 2. The distribution of the oxygen chemical concentration $C_{OX}$ of the this example has a lower surface side oxygen reduction region 454 in addition to the maximum value region 452 and the upper surface side oxygen reduction region 450 illustrated in FIG. 2. The lower surface side oxygen reduction region 454 is a region which is in contact with the lower surface 23 and in which the oxygen chemical concentration $C_{OX}$ decreases toward the lower surface 23. The maximum value region 452 is arranged between the upper surface side oxygen reduction region 450 and the lower surface side oxygen reduction region 454.

The lower surface side oxygen reduction region 454 may be a region where the oxygen chemical concentration $C_{OX}$ gradually decreases as compared with the upper surface side oxygen reduction region 450. The lower surface side oxygen reduction region 454 may be longer than the upper surface side oxygen reduction region 450 in the depth direction. As a result, the variation of the oxygen chemical concentration $C_{OX}$ in the semiconductor substrate 10 can be made relatively small as compared with the case where the upper surface side oxygen reduction region 450 is long. The length of the lower surface side oxygen reduction region 454 in the depth direction may be 30% or more, 40% or more, or 50% or more of the substrate thickness. The second peak 402 and the fourth peak 404 of the this example are arranged in the lower surface side oxygen reduction region 454.

Also in the this example, the first peak 401 may be arranged in the upper surface side oxygen reduction region 450. The depth position Z1 of the first peak 401 may be arranged closer to the upper surface 21 than the depth position Zc. The depth position Z1 of the first peak 401 may be arranged closer to the upper surface 21 than the depth position $Z_p$. The depth position Z1 of the first peak 401 may be arranged closer to the upper surface 21 than the depth position $Z_b$. The depth position Z1 of the first peak 401 may be arranged between the depth position $Z_p$ and the depth position $Z_b$.

Figure 4:
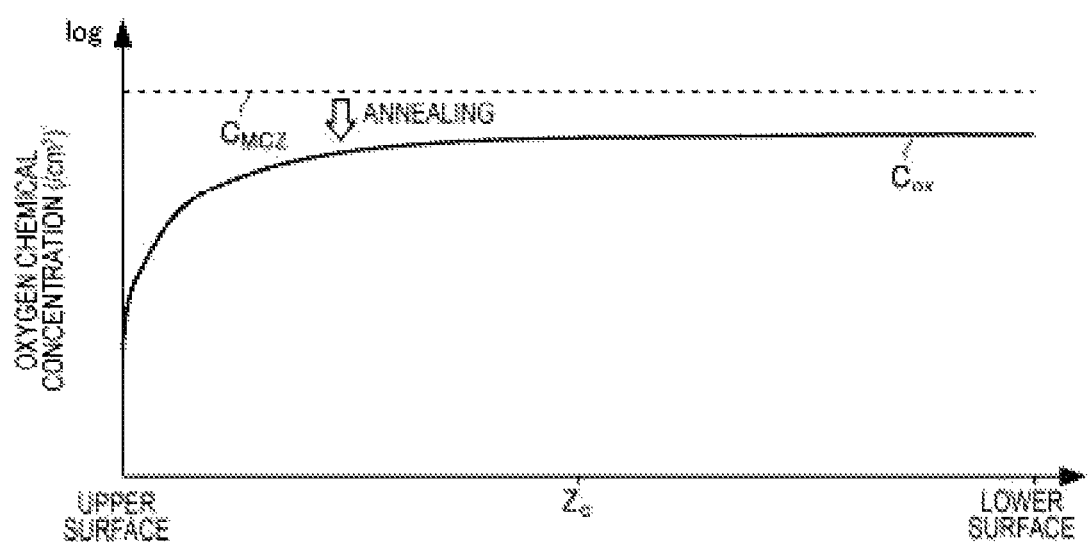
FIG. 4 illustrates a diagram showing an example of a variation in oxygen chemical concentration distribution of an MCZ substrate before and after oxygen annealing.

FIG. 4 illustrates a diagram showing an example of a variation in oxygen chemical concentration distribution of the MCZ substrate before and after oxygen annealing.

Before oxygen annealing, the MCZ substrate has a relatively high oxygen chemical concentration $C_{MCZ}$. The oxygen chemical concentration $C_{MCZ}$ is higher than the solid solubility limit of the oxygen annealing temperature, for example. When such a substrate is subjected to oxygen annealing, oxygen in the substrate diffuses outward, and the oxygen chemical concentration $C_{OX}$ of the substrate becomes approximately equal to the solid solubility limit. However, since outward diffusion is promoted in the vicinity of the upper surface 21 of the semiconductor substrate 10, the oxygen chemical concentration $C_{OX}$ decreases as approaching the upper surface 21. Note that the lower surface 23 side of the semiconductor substrate 10 of the this example is ground after oxygen annealing. Therefore, the oxygen chemical concentration $C_{OX}$ is approximately constant on the lower surface 23 side.

Figure 5:
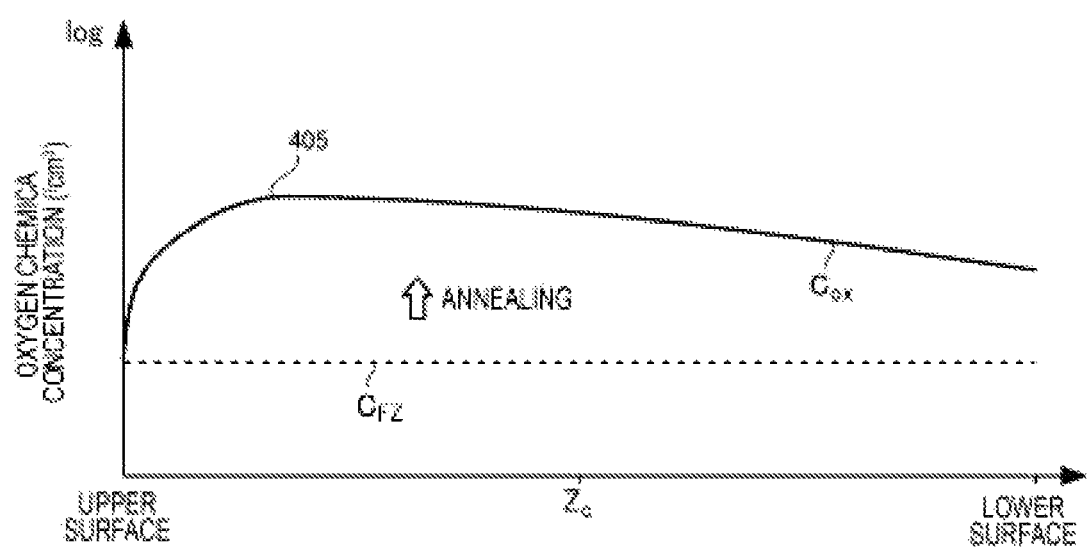
FIG. 5 illustrates a diagram showing an example of a variation in oxygen chemical concentration distribution of an FZ substrate before and after oxygen annealing.

FIG. 5 illustrates a diagram showing an example of a variation in oxygen chemical concentration distribution of the FZ substrate before and after oxygen annealing. Before oxygen annealing, the FZ substrate has a relatively low oxygen chemical concentration $C_{FZ}$. The oxygen chemical concentration $C_{FZ}$ is lower than the solid solubility limit of the oxygen annealing temperature, for example. When such a substrate is subjected to oxygen annealing, oxygen is introduced into the substrate, and in a region where the distance from the upper surface 21 of the semiconductor substrate 10 is small, the oxygen chemical concentration $C_{OX}$ in the substrate becomes approximately equal to the solid solubility limit. In a region where the distance from the upper surface 21 is large, oxygen is difficult to be introduced, so that the oxygen chemical concentration $C_{OX}$ gradually decreases as the distance from the upper surface 21 increases. Since the outward diffusion is promoted in the vicinity of the upper surface 21 of the semiconductor substrate 10, the oxygen chemical concentration $C_{OX}$ decreases as approaching the upper surface 21. Therefore, the oxygen chemical concentration $C_{OX}$ may have an oxygen concentration peak 405. Note that the lower surface 23 side of the semiconductor substrate 10 of the this example is ground after oxygen annealing. Therefore, on the lower surface 23 side, the oxygen chemical concentration $C_{OX}$ does not have a peak and gradually and monotonously decreases toward the lower surface 23.

In either one of the examples illustrated in FIG. 4 and FIG. 5, even if the original oxygen chemical concentration is different, the oxygen chemical concentration inside the semiconductor substrate 10 can be controlled by the oxygen annealing temperature or the like. Therefore, it is possible to reduce variations in VOH defect concentration.

Figure 6:
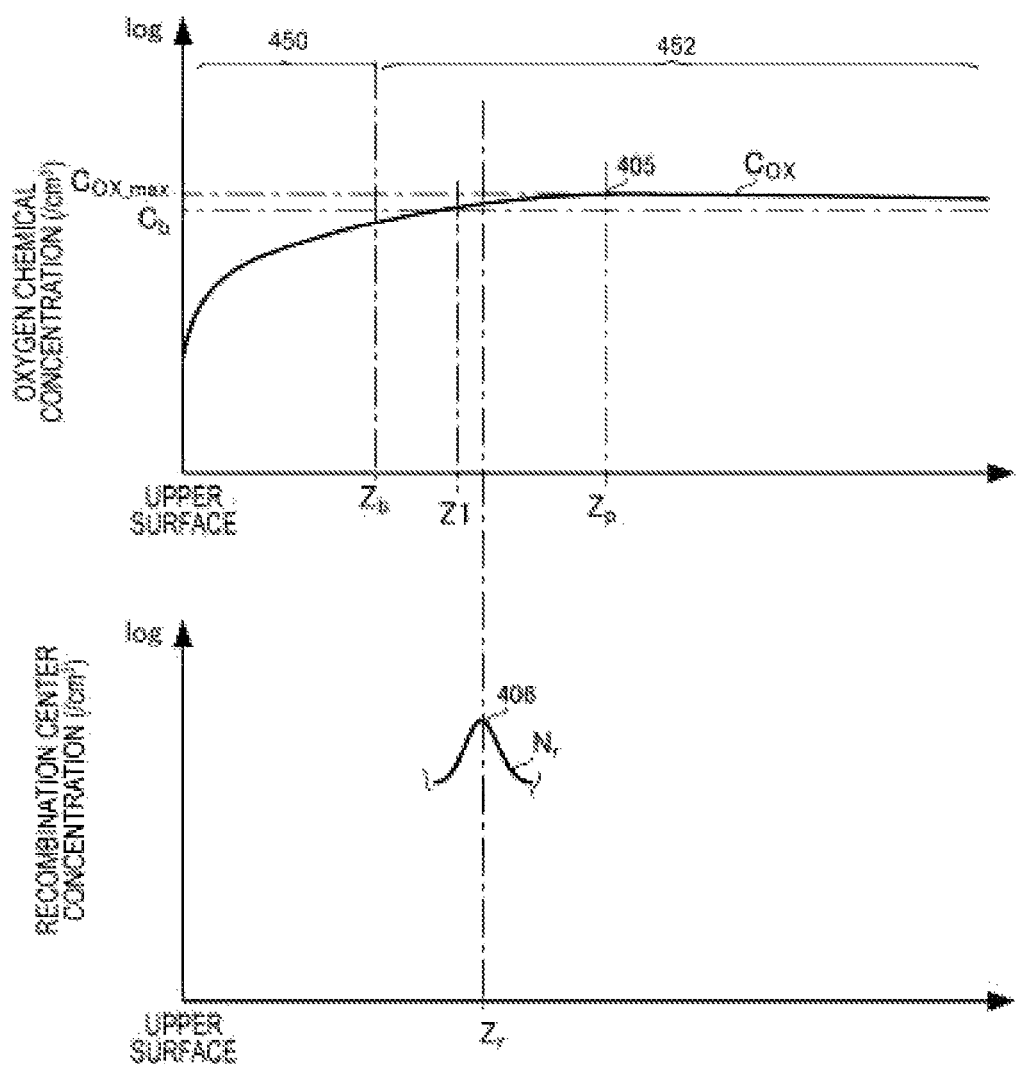
FIG. 6 illustrates a diagram showing a distribution example of a recombination center concentration $N_r$ and an oxygen chemical concentration $C_{OX}$.

FIG. 6 illustrates a diagram showing a distribution example of the recombination center concentration $N_r$ and the oxygen chemical concentration $C_{OX}$. The oxygen chemical concentration $C_{OX}$ is the same as in the example illustrated in FIG. 2 or 3. In FIG. 6, the vicinity of the upper surface 21 is enlarged and illustrated in the distribution of the oxygen chemical concentration $C_{OX}$ illustrated in FIG. 3.

In the semiconductor device 100, a recombination center such as a vacancy defect may be formed for the purpose of adjusting the lifetime of the carrier. For example, the recombination center can be formed by the implantation of charged particles such as hydrogen, helium, or an electron beam into the semiconductor substrate 10. In the this example, the recombination center concentration $N_r$ has a recombination center peak 406 at the depth position $Z_r$. For example, a calculation method using well-known calculation software or tool is known as the vacancy concentration (see, for example, http://www.srim.org/). Further, the position of the local minimum value of the specific resistance distribution in the depth direction of the semiconductor substrate 10 may be set as the position of the recombination center peak 406.

The recombination center peak 406 may be formed in a region where the oxygen chemical concentration $C_{OX}$ is 70% or more on the upper surface 21 side of the semiconductor substrate 10. The recombination center peak 406 may be combined to hydrogen to form a VOH defect. Therefore, if the variation in the oxygen chemical concentration $C_{OX}$ is large, the concentration of the recombination center tends to vary, and it becomes difficult to precisely adjust the lifetime of the carrier. In the this example, since the recombination center peak 406 is arranged in a region where the concentration of the oxygen chemical concentration $C_{OX}$ is relatively stable, the concentration of the recombination center can be easily controlled, and the lifetime of the carrier can be precisely adjusted. The recombination center peak 406 may be formed in a region where the oxygen chemical concentration $C_{OX}$ is 80% or more of the maximum value $C_{OX\_max}$, or may be arranged in a region where the oxygen chemical concentration $C_{OX}$ is 90% or more.

The depth position $Z_r$ may be the same position as the depth position Z1 into which the charged particle beam is implanted. That is, the carrier lifetime may be adjusted by the implantation of the charged particle beam into the depth position Z1. Further, the depth position $Z_r$ may be a position near the depth position Z1 and closer to the implantation surface of the charged particle beam (the lower surface 23 in the this example) than the depth position Z1. In a case where the charged particles implanted into the depth position Z1 are hydrogen ions, recombination centers in the vicinity of the depth position Z1 are combined to hydrogen to form VOH defects. Therefore, the concentration of the recombination centers at the depth position Z1 decreases, and the depth position $Z_r$ shifts toward the implantation surface of the hydrogen ions (the lower surface 23 in the this example). The distance between the depth position Z1 and the depth position $Z_r$ may be 5 μm or less, 3 μm or less, or 1 μm or less.

In another example, the depth position $Z_r$ may be a position different from the depth position Z1. In this case, apart from the implantation of the charged particle beam into the depth position Z1, the charged particle beam is also implanted into the depth position $Z_r$. The implantation of the charged particle beam into the depth position $Z_r$ may be performed after hydrogen annealing for diffusing hydrogen implanted into the depth position Z2.

Figure 7:
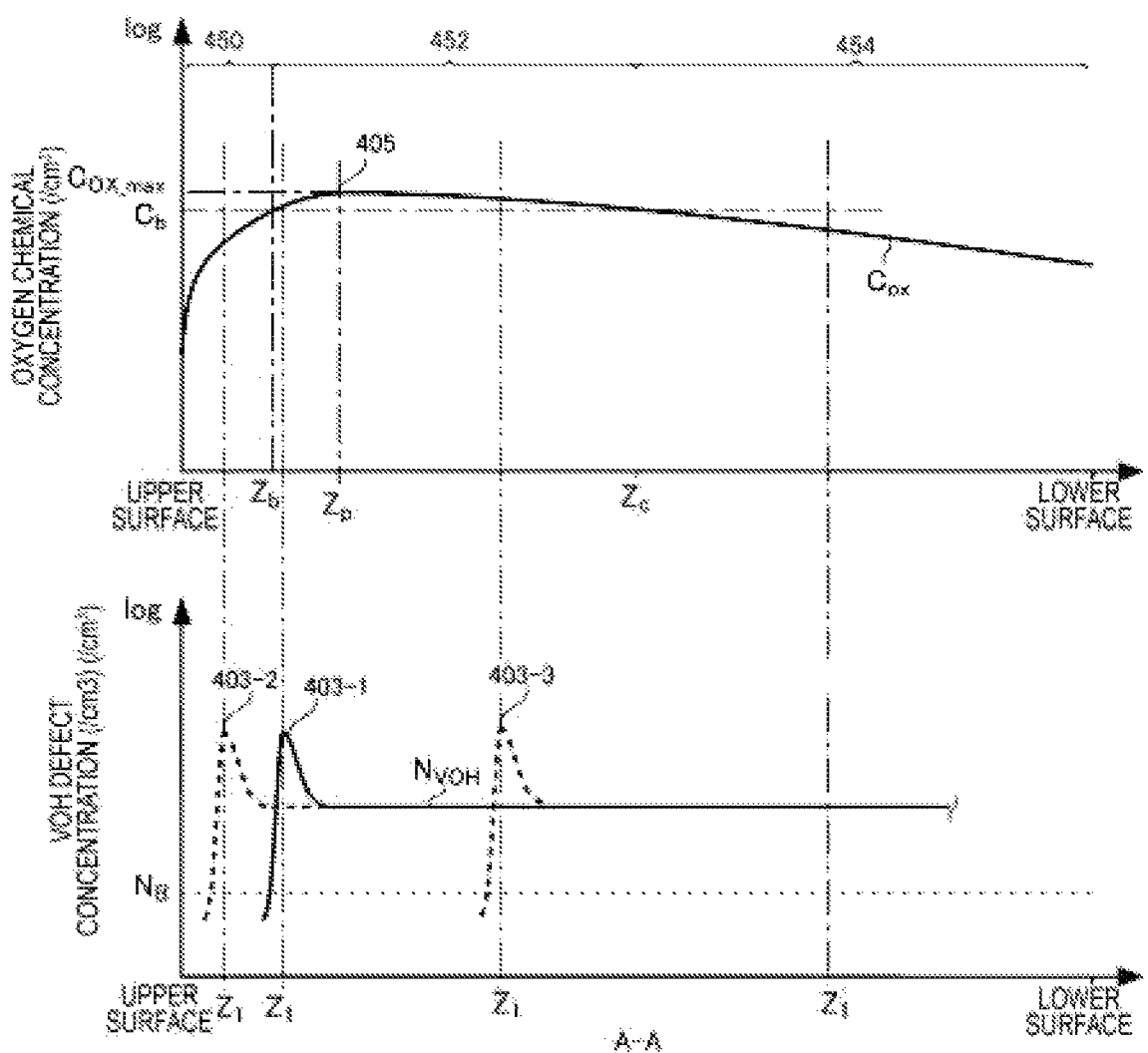
FIG. 7 illustrates a diagram describing a position of a third peak 403.

FIG. 7 illustrates a diagram for describing the position of the third peak 403. In FIG. 7, a modification of the position of the third peak 403 is illustrated as third peaks 403-1, 403-2, and 403-3. Any of the third peaks 403 is provided in the semiconductor substrate 10. The third peak 403-1 is arranged between the oxygen concentration peak 405 and the boundary position Zb. The boundary position Zb is a boundary position between the maximum value region 452 of the oxygen chemical concentration $C_{OX}$ and the upper surface side oxygen reduction region 450. This makes it possible to form the high concentration region 460 (see FIG. 2 and FIG. 3) long and to suppress variations in the value of the third peak 403.

The third peak 403-2 according to another example is arranged in the upper surface side oxygen reduction region 450. In this case, the high concentration region 460 can be formed even longer. The third peak 403-3 according to another example is arranged between the oxygen concentration peak 405 and the depth position Zc. In this case, the third peak 403-3 can be arranged in a region where the variation of the oxygen chemical concentration $C_{OX}$ is relatively gradual. The third peak 403-3 may be arranged in the maximum value region 452.

Figure 8:
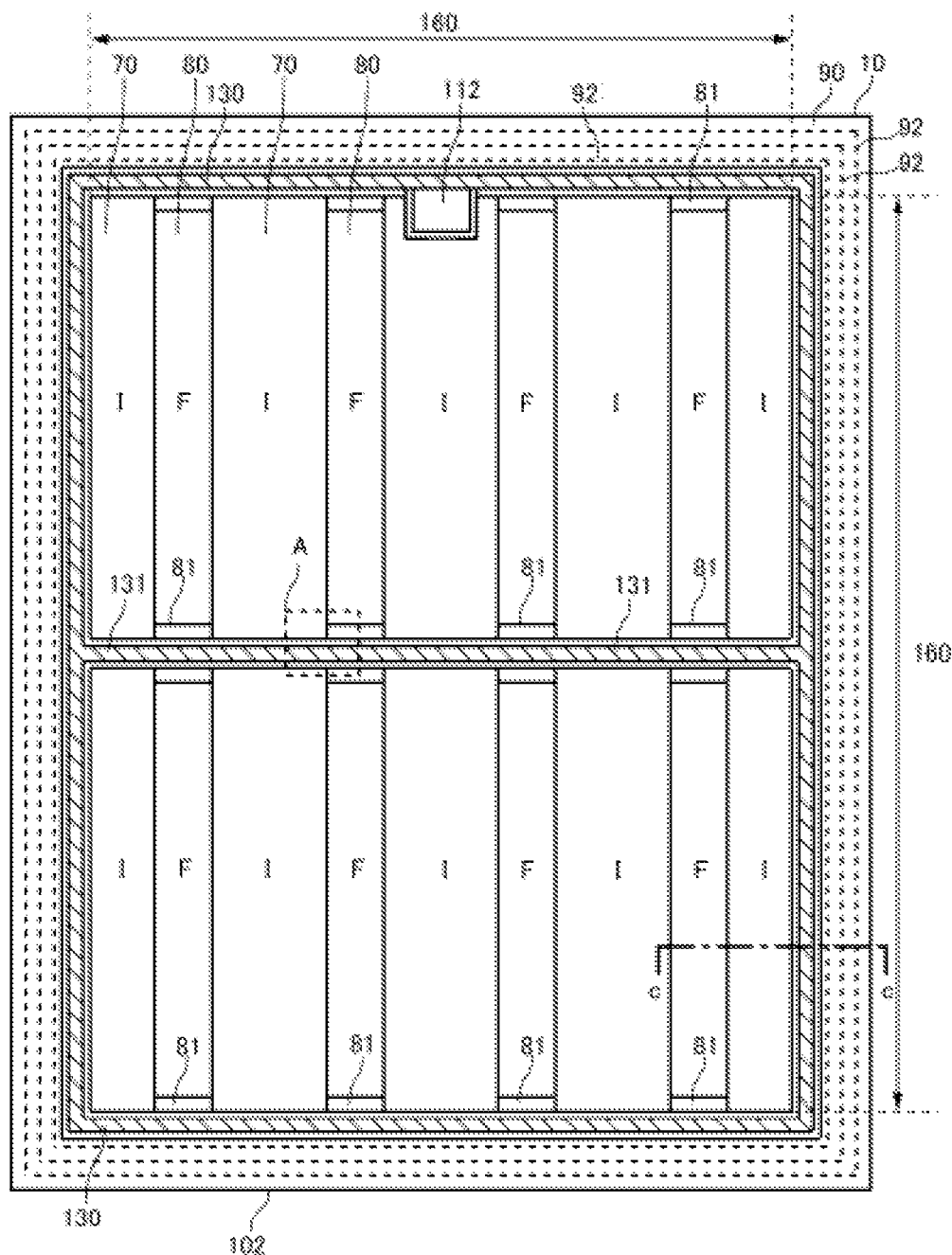
FIG. 8 illustrates an example of a top view of the semiconductor device 100.

FIG. 8 illustrates an example of a top view of the semiconductor device 100. FIG. 8 illustrates a position where each member is projected on the upper surface of the semiconductor substrate 10. In FIG. 8, only some members of the semiconductor device 100 are illustrated, and some members are omitted.

The semiconductor device 100 includes the semiconductor substrate 10 described with reference to FIG. 1 to FIG. 7. The semiconductor substrate 10 has an end side 102 in the top view. When merely referred to as the top view in the present specification, it means that the semiconductor substrate 10 is viewed from an upper surface side. The semiconductor substrate 10 of this example has two sets of end sides 102 opposite to each other in the top view. In FIG. 1, the X axis and the Y axis are parallel to any of the end sides 102. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 8.

The active portion 160 is provided with at least one of a transistor portion 70 including a transistor element such as an IGBT, and a diode portion 80 including a diode element such as a freewheeling diode (FWD). In the example of FIG. 8, the transistor portion 70 and the diode portion 80 are arranged alternately along a predetermined array direction (the X axis direction in the this example) in the upper surface of the semiconductor substrate 10. The active portion 160 in another example may be provided with only one of the transistor portion 70 and the diode portion 80.

In FIG. 8, a region where the transistor portion 70 is arranged is denoted by a symbol "I", and a region where the diode portion 80 is arranged is denoted by a symbol "F". In the present specification, a direction perpendicular to the array direction in a top view may be referred to as an extending direction (Y axis direction in FIG. 8). Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described later may be the same.

Each of the diode portions 80 includes a cathode region of N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of P+ type of may be provided in a region other than the cathode region. In the specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 112. The semiconductor device 100 may have a pad such as an anode pad, a cathode pad, and a current detection pad. Each pad is arranged in a region close to the end side 102. The region close to the end side 102 refers to a region between the end side 102 and the emitter electrode in the top view. In implementation of the semiconductor device 100, each pad may be connected to an external circuit via wiring such as a wire.

A gate potential is applied to the gate pad 112. The gate pad 112 is electrically connected to the conductive portion of the gate trench portion of the active portion 160. The semiconductor device 100 includes a gate runner that connects the gate pad 112 and the gate trench portion. In FIG. 8, the gate runner is hatched with diagonal lines.

The gate runner of this example has an outer circumferential gate runner 130 and an active-side gate runner 131. The outer circumferential gate runner 130 is arranged between the active portion 160 and the end side 102 of the semiconductor substrate 10 in the top view. The outer circumferential gate runner 130 of this example encloses the active portion 160 in the top view. A region enclosed by the outer circumferential gate runner 130 in the top view may be the active portion 160. The outer circumferential gate runner 130 is connected to the gate pad 112. The outer circumferential gate runner 130 is arranged above the semiconductor substrate 10. The outer circumferential gate runner 130 may be a metal wiring including aluminum.

The active-side gate runner 131 is provided in the active portion 160. With the provision of the active-side gate runner 131 in the active portion 160, it is possible to reduce a variation in wiring length from the gate pad 112 in each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction. When the active portion 160 is divided by the active-side gate runner 131, the transistor portion 70 and the diode portion 80 may be alternately arranged in the X axis direction in each divided region.

Further, the semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 of the this example includes an edge termination structure portion 90 between the active portion 160 and the end side 102. The edge termination structure portion 90 of this example is arranged between the outer circumferential gate runner 130 and the end side 102. The edge termination structure portion 90 reduces an electric field strength on the upper surface side of the semiconductor substrate 10. The edge termination structure portion 90 includes a plurality of guard rings 92. The guard ring 92 is a P type region in contact with the upper surface of the semiconductor substrate 10. The guard ring 92 may enclose the active portion 160 in a top view. The plurality of guard rings 92 are arranged at predetermined intervals between the outer circumferential gate runner 130 and the end side 102. The guard ring 92 arranged on the outer side may enclose the guard ring 92 arranged on the inner side by one. The outer side refers to a side close to the end side 102, and the inner side refers to a side close to the outer circumferential gate runner 130. By providing the plurality of guard rings 92, the depletion layer on the upper surface side of the active portion 160 can be extended outward, and the breakdown voltage of the semiconductor device 100 can be improved. The edge termination structure portion 90 may further include at least one of a field plate and a RESURF annularly provided enclosing the active portion 160.

Figure 9:
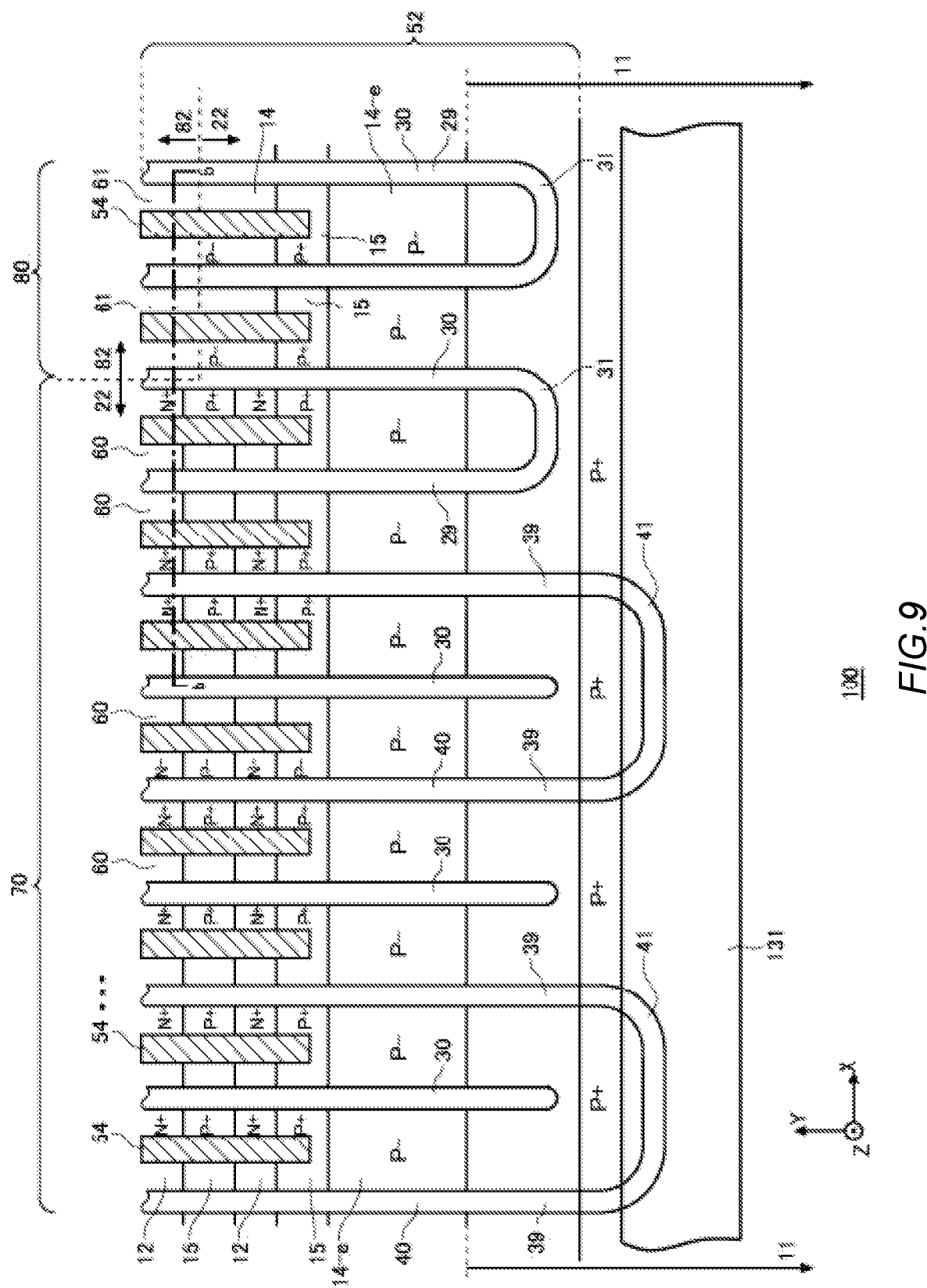
FIG. 9 illustrates an enlarged view of a region A in FIG. 8.

FIG. 9 illustrates an enlarged view of a region A in FIG. 8. The region A is a region including the transistor portion 70, the diode portion 80, and the active-side gate runner 131. The semiconductor device 100 of this example includes a gate trench portion 40, a dummy trench portion 30, a well region 11, an emitter region 12, a base region 14, and a contact region 15 which are provided inside the upper surface side of the semiconductor substrate 10. Each of the gate trench portion 40 and the dummy trench portion 30 is an example of a trench portion. Further, the semiconductor device 100 of this example includes an emitter electrode 52 and the active-side gate runner 131 that are provided above the upper surface of the semiconductor substrate 10. The emitter electrode 52 and the active-side gate runner 131 are provided in isolation each other.

An interlayer dielectric film is provided between the emitter electrode 52 and the active-side gate runner 131, and the upper surface of the semiconductor substrate 10, but is omitted in FIG. 9. In the interlayer dielectric film of this example, a contact hole 54 is provided passing through the interlayer dielectric film. In FIG. 9, each contact hole 54 is hatched with diagonal lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material including a metal. FIG. 9 illustrates a range in which the emitter electrode 52 is provided. For example, at least a partial region of the emitter electrode 52 is formed of aluminum or an aluminum-silicon alloy, for example, a metal alloy such as AlSi or AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided overlapping the active-side gate runner 131. The well region 11 is provided so as to extend with a predetermined width even in a range not overlapping the active-side gate runner 131. The well region 11 of this example is provided away from an end of the contact hole 54 in the Y axis direction toward the active-side gate runner 131 side. The well region 11 is a second conductivity type region in which the doping concentration is higher than the base region 14. The base region 14 of this example is a P− type, and the well region 11 is a P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 extending along the extending direction perpendicular to the array direction (portions of a trench that are linear along the extending direction), and the edge portion 41 connecting the two linear portions 39. The extending direction in FIG. 9 is the Y axis direction.

At least a part of the edge portion 41 is preferably provided in a curved shape in a top view. By connecting between end portions of the two linear portions 39 in the Y axis direction by the edge portion 41, it is possible to reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided or a plurality of dummy trench portions 30 may be provided. The dummy trench portion 30 may have a linear shape extending in the extending direction, or may have linear portions 29 and an edge portion 31 similar to the gate trench portion 40. The semiconductor device 100 illustrated in FIG. 9 includes both the linear dummy trench portion 30 not having the edge portion 31 and the dummy trench portion 30 having the edge portion 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. In other words, the bottom in the depth direction of each trench portion is covered with the well region 11 at the end portion in the Y axis direction of each trench portion. With this configuration, the electric field strength on the bottom portion of each trench portion can be reduced.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench portion, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-e. In FIG. 9, the base region 14-e arranged at one end portion of each mesa portion in the extending direction is illustrated, but the base region 14-e is also arranged at the other end portion of each mesa portion. Each mesa portion may be provided with at least one of a first conductivity type of emitter region 12, and a second conductivity type of contact region 15 in a region sandwiched between the base regions 14-e in the top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The mesa portion 61 of the diode portion 80 is not provided with the emitter region 12. The base region 14 and the contact region 15 may be provided on an upper surface of the mesa portion 61. In the region sandwiched between the base regions 14-e on the upper surface of the mesa portion 61, the contact region 15 may be provided in contact with each base region 14-e. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-e. The contact hole 54 of this example is provided above respective regions of the contact region 15, the base region 14, and the emitter region 12. The contact hole 54 is not provided in regions corresponding to the base region 14-e and the well region 11. The contact hole 54 may be arranged at the center of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, a collector region of the P+ type 22 may be provided in a region where the cathode region 82 is not provided. In FIG. 9, the boundary between the cathode region 82 and the collector region 22 is indicated by a dotted line.

The cathode region 82 is arranged separately from the well region 11 in the Y axis direction. With this configuration, the distance between the P type region (the well region 11) having a relatively high doping concentration and formed up to the deep position, and the cathode region 82 is ensured, so that the breakdown voltage can be improved. The end portion in the Y axis direction of the cathode region 82 of this example is arranged farther away from the well region 11 than the end portion in the Y axis direction of the contact hole 54. In another example, the end portion in the Y axis direction of the cathode region 82 may be arranged between the well region 11 and the contact hole 54.

Figure 10:
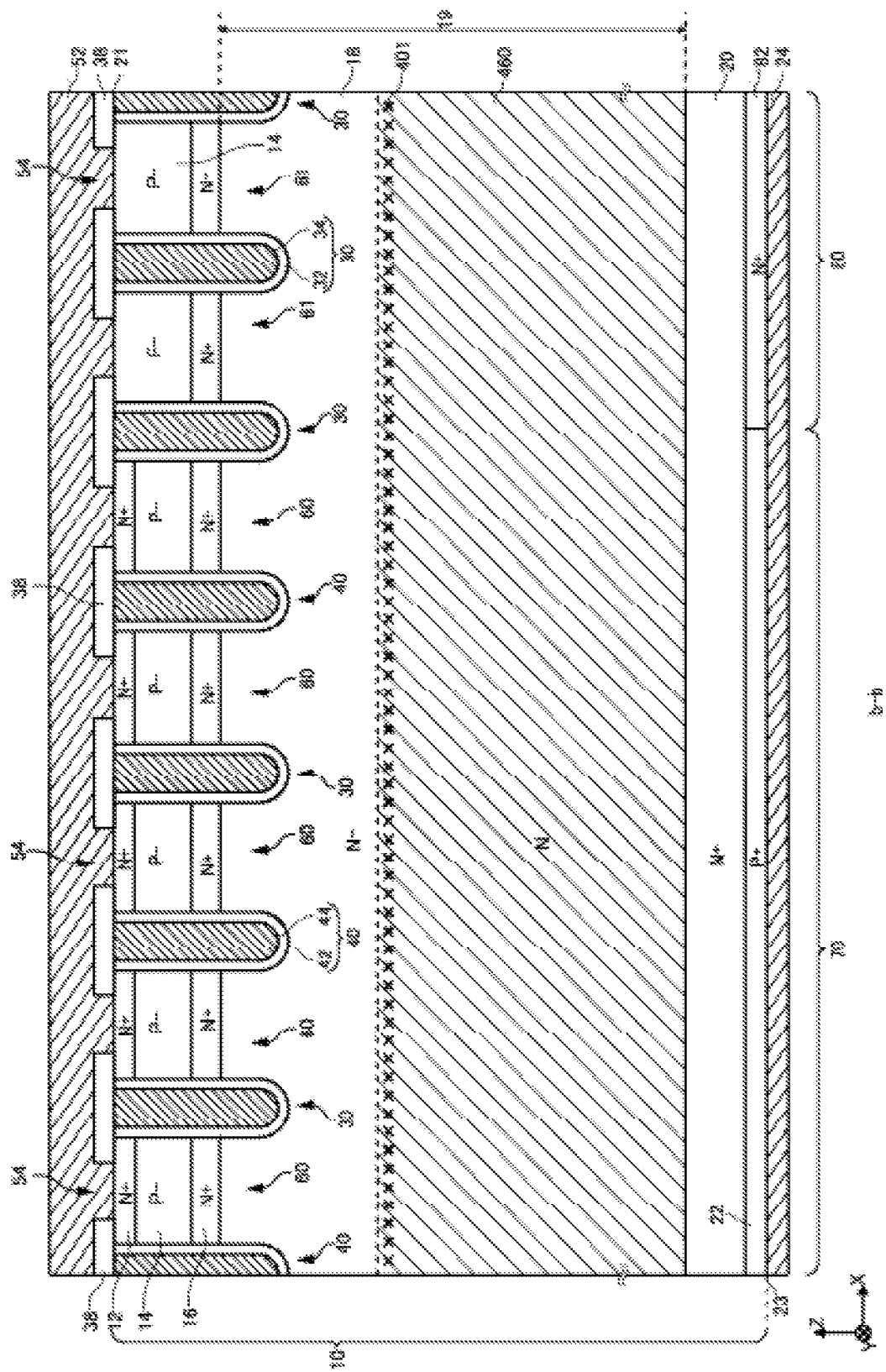
FIG. 10 illustrates a diagram showing an example of a cross section b-b in FIG. 9.

FIG. 10 illustrates a diagram showing an example of a cross section b-b in FIG. 9. The cross section b-b is an XZ plane passing through the emitter region 12 and the cathode region 82. The semiconductor device 100 of this example includes the semiconductor substrate 10, the interlayer dielectric film 38, the emitter electrode 52, and the collector electrode 24 in the cross section. The interlayer dielectric film 38 is provided on the upper surface of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 9.

The emitter electrode 52 is provided on the upper side of the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are made of a metal material such as aluminum. In the specification, the direction in which the emitter electrode 52 is connected to the collector electrode 24 (the Z axis direction) is referred to as a depth direction.

The semiconductor substrate 10 has an N− type bulk doping region 18. The bulk doping region 18 is a region where the doping concentration of the bulk doping region 18 matches the donor concentration of the bulk donor. The bulk doping region 18 is provided in each of the transistor portion 70 and the diode portion 80.

In the mesa portion 60 of the transistor portion 70, an N+ type of emitter region 12 and a P− type of base region 14 are provided in order from an upper surface 21 side of the semiconductor substrate 10. The bulk doping region 18 is provided below the base region 14. The mesa portion 60 may be provided with an N+ type of accumulation region 16. The accumulation region 16 is arranged between the base region 14 and the bulk doping region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the bulk doping region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region having a higher doping concentration than the bulk doping region 18. By providing the high-concentration accumulation region 16 between the bulk doping region 18 and the base region 14, the implantation enhancement effect (IE effect) of the carrier can be improved, and the ON voltage can be reduced. The accumulation region 16 may be provided to cover a whole lower surface of the base region 14 in each mesa portion 60.

The mesa portion 61 of the diode portion 80 is provided with the P− type of base region 14 in contact with the upper surface 21 of the semiconductor substrate 10. The bulk doping region 18 is provided below the base region 14. In the mesa portion 61, the accumulation region 16 may be provided below the base region 14.

In each of the transistor portion 70 and the diode portion 80, an N+ type buffer region 20 may be provided on the lower surface 23 side with respect to the bulk doping region 18 and the high concentration region 460. The doping concentration of the buffer region 20 is higher than the doping concentration of the bulk doping region 18. The buffer region 20 has one or more donor concentration peaks with higher donor concentrations than the bulk doping region 18. The plurality of donor concentration peaks are arranged at different positions in the depth direction of the semiconductor substrate 10. The donor concentration peak of the buffer region 20 may be, for example, a concentration peak of hydrogen (proton) or phosphorous. The buffer region 20 may include the second peak 402 of hydrogen chemical concentration (see FIG. 2 and the like). The buffer region 20 may function as a field stopper layer which prevents a depletion layer expanding from the lower end of the base region 14 from reaching the collector region of the P+ type 22 and the cathode region 82 of the N+ type 82.

In the transistor portion 70, the collector region of the P+ type 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. The donor concentration of the cathode region 82 is higher than the donor concentration of the bulk doping region 18. A donor of the cathode region 82 is, for example, hydrogen or phosphorous. Note that an element serving as a donor and an acceptor in each region is not limited to the above described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 to reach the bulk doping region 18. In the region where at least one of the emitter region 12, the contact region 15, and the accumulation region 16 is provided, each trench portion also penetrates these doping regions and reaches the bulk doping region 18. The configuration of the trench portion penetrating the doping region is not limited to the one manufactured in the order of forming the doping region and then forming the trench portion. The configuration of the trench portion penetrating the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 may be connected to an electrode different from the gate pad. For example, the dummy conductive portion 34 may be connected to a dummy pad (not illustrated) connected to an external circuit different from the gate pad, and control different from that of the gate conductive portion 44 may be performed. The dummy conductive portion 34 may be electrically connected to the emitter electrode 52. The dummy dielectric film 32 is provided covering an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. It is noted that the bottoms of the dummy trench portion 30 and the gate trench portion 40 may be formed in a curved-surface shape (a curved-line shape in the cross section) convexly downward.

The semiconductor substrate 10 has distributions of the oxygen chemical concentration $C_{OX}$, the impurity chemical concentration $C_I$, the hydrogen chemical concentration $C_H$, and the VOH defect concentration $N_{VOH}$ similar to any of the examples described in FIG. 1 to FIG. 6. In FIG. 10, the first peak 401 is indicated by a cross mark, and the high concentration region 460 is hatched with diagonal lines. The buffer region 20, the cathode region 82, and the collector region 22 may also be included in the high concentration region 460, but diagonal line is omitted in FIG. 10. The high concentration region 460 may be provided from the first peak 401 to the lower surface 23.

As described above, the high concentration region 460 includes VOH defects. The bulk doping region 18 and the high concentration region 460 may be collectively referred to as a drift region 19. The drift region 19 may be a region in which a depletion layer expands when a voltage is applied to the semiconductor device 100 and which supports half or more of the applied voltage.

Figure 11:
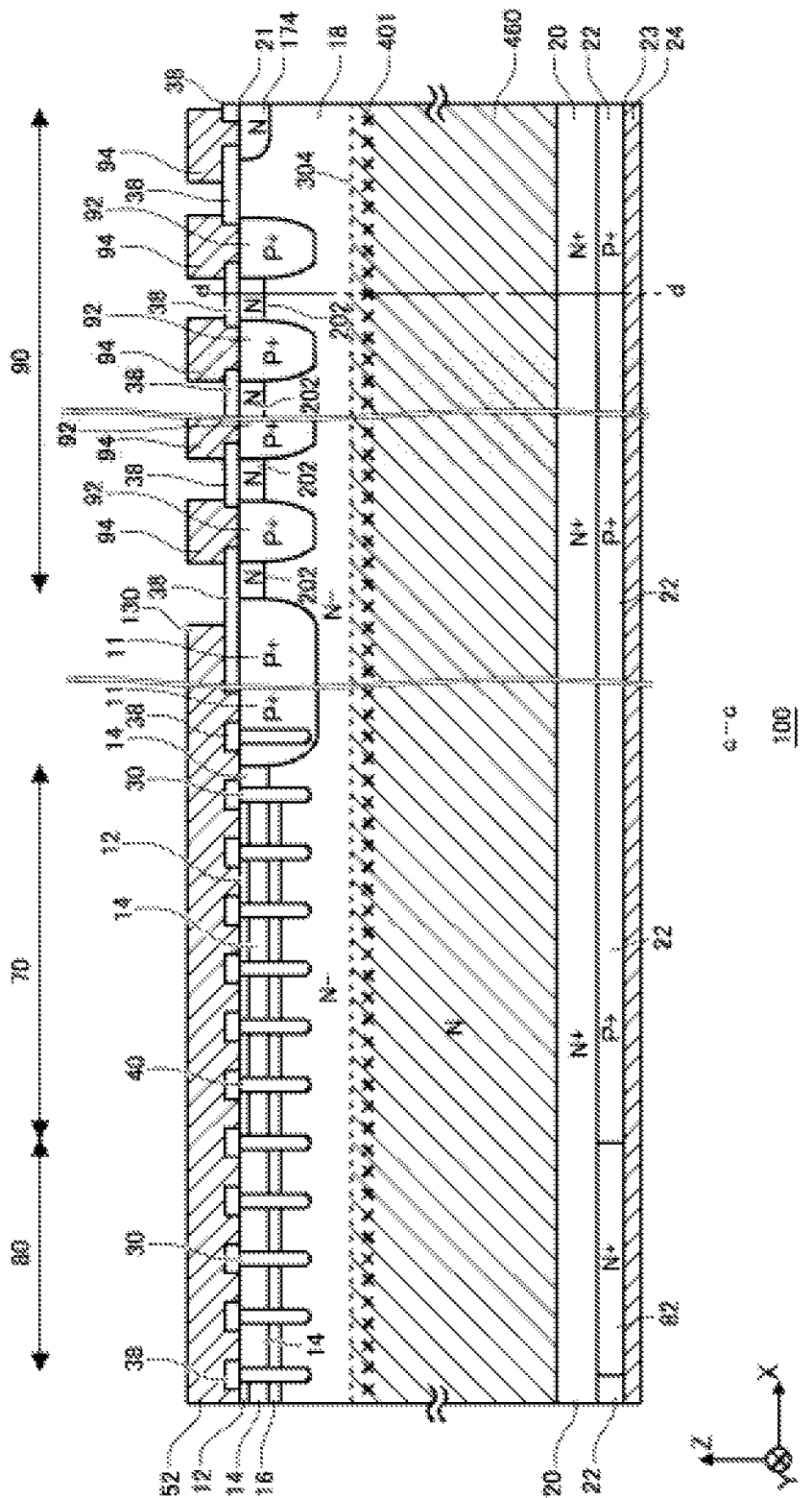
FIG. 11 illustrates a diagram showing an example of a cross section c-c in FIG. 8.

FIG. 11 illustrates a diagram showing an example of a cross section c-c in FIG. 8. The cross section c-c is an XZ plane passing through the edge termination structure portion 90, the transistor portion 70, and the diode portion 80. The structures of the transistor portion 70 and the diode portion 80 are the same as those of the transistor portion 70 and the diode portion 80 described in FIG. 9 and FIG. 10. In FIG. 11, the structures of the gate trench portion 40 and the dummy trench portion 30 are illustrated in a simplified manner.

In the semiconductor substrate 10, the well region 11 is provided between the edge termination structure portion 90 and the transistor portion 70. The well region 11 is a P+ type region in contact with the upper surface 21 of the semiconductor substrate 10. The well region 11 may be provided up to a position deeper than the lower ends of the gate trench portion 40 and the dummy trench portion 30. A part of the gate trench portion 40 and a part of the dummy trench portion 30 may be arranged inside the well region 11.

An interlayer dielectric film 38 covering the well region 11 may be provided in the upper surface 21 of the semiconductor substrate 10. Above the interlayer dielectric film 38, electrodes and wiring such as the emitter electrode 52 and the outer circumferential gate runner 130 are provided. The emitter electrode 52 is provided extending from above the active portion 160 to above the well region 11. The emitter electrode 52 may be connected to the well region 11 via a contact hole provided in the interlayer dielectric film 38.

The outer circumferential gate runner 130 is arranged between the emitter electrode 52 and the edge termination structure portion 90. Although the emitter electrode 52 and the outer circumferential gate runner 130 are arranged separately from each other, a gap between the emitter electrode 52 and the outer circumferential gate runner 130 is omitted in FIG. 11. The outer circumferential gate runner 130 is electrically insulated from the well region 11 by the interlayer dielectric film 38.

The edge termination structure portion 90 is provided with a plurality of guard rings 92, a plurality of second high concentration regions 202, a plurality of field plates 94, and a channel stopper 174. In addition, the first peak 401 and the high concentration region 460 are also provided in at least a part of the edge termination structure portion 90. The high concentration region 460 may be provided below the guard ring 92. The first peak 401 and the high concentration region 460 of the edge termination structure portion 90 may be provided continuously with the first peak 401 and the high concentration region 460 of the transistor portion 70 and the diode portion 80. The first peak 401 and the high concentration region 460 may be provided over the entire edge termination structure portion 90 in the X axis direction.

The first peak 401 of the this example is provided below the second high concentration region 202 (that is, a position deeper than the second high concentration region 202 as viewed from the upper surface 21) described later. The first peak 401 may be arranged at a position deeper than the lower end of the guard ring 92. That is, first peak 401 may be arranged between the lower end of guard ring 92 and lower surface 23 of semiconductor substrate 10. The first peak 401 may be arranged at a position deeper than the lower end of the well region 11. The first peak 401 may be arranged at a position deeper than the lower end of the trench portion.

Although the high concentration region 460 illustrated in FIG. 11 is not in contact with the guard ring 92, the high concentration region 460 may be in contact with the lower end of the guard ring 92. The high concentration region 460 may be provided up to between the two guard rings 92. The high concentration region 460 may or may not be in contact with the well region 11. The high concentration region 460 may or may not be in contact with the trench portion. The high concentration region 460 may be provided below the second high concentration region 202.

The high concentration region 460 may be in contact with the well region 11. The high concentration region 460 may be in contact with the trench portion. The high concentration region 460 may not be in contact with any of the emitter region 12, the base region 14, and the accumulation region 16. In another example, the high concentration region 460 may be in contact with the accumulation region 16. The high concentration region 460 may be in contact with the base region 14. The high concentration region 460 may not be in contact with or may be in contact with the channel stopper 174.

The high concentration regions 460 may have the same or different lengths in the depth direction throughout the edge termination structure portion 90. In the high concentration region 460, the edge termination structure portion 90 and the active portion 160 may have the same or different lengths in the depth direction.

In the edge termination structure portion 90, a collector region 22 may be provided in a region in contact with the lower surface 23. Each guard ring 92 may be provided to enclose the active portion 160 in the upper surface 21. The plurality of guard rings 92 may have a function of expanding the depletion layer generated in the active portion 160 to the outside of the semiconductor substrate 10. As a result, electric field strength inside the semiconductor substrate 10 can be prevented, and the breakdown voltage of the semiconductor device 100 can be improved.

The guard ring 92 of the this example is a P+ type semiconductor region formed by the implantation of ions in the vicinity of the upper surface 21. The guard ring 92 can be formed by selectively implanting a P type dopant such as boron from the upper surface 21 of the semiconductor substrate 10 and performing heat treatment. The depth of the bottom portion of the guard ring 92 may be deeper than the depths of the bottom portions of the gate trench portion 40 and the dummy trench portion 30. The depth of the bottom portion of the guard ring 92 may be the same as or different from the depth of the bottom portion of the well region 11.

The upper surface of the guard ring 92 is covered with the interlayer dielectric film 38. The field plate 94 is formed of a metal such as aluminum or a conductive material such as polysilicon. The field plate 94 may be formed of an aluminum-silicon alloy, for example, a metal alloy such as AlSi or AlSiCu. The field plate 94 may be formed of the same material as the outer circumferential gate runner 130 or the emitter electrode 52. The field plate 94 is provided on the interlayer dielectric film 38. The field plate 94 of the this example is connected to the guard ring 92 through a through hole provided in the interlayer dielectric film 38.

The channel stopper 174 is an N type or P type region arranged further outside the outermost guard ring 92 and exposed to the upper surface 21 of the semiconductor substrate 10. Note that the term "outside" refers to a side on which the distance from the active portion 160 increases in a top view. That is, the outermost guard ring 92 refers to the guard ring 92 farthest from the active portion 160 in the X axis direction. The channel stopper 174 of the this example is provided to be exposed to the upper surface 21 and the side wall in the vicinity of the end side 102 of the semiconductor substrate 10. The channel stopper 174 is an N type region having a doping concentration higher than that of the bulk doping region 18. The doping concentration of the channel stopper 174 may be higher than the doping concentration of the high concentration region 460. The channel stopper 174 has a function of terminating the depletion layer, which is generated in the active portion 160, in the vicinity of the end side 102 of the semiconductor substrate 10. Note that, although at least a part of the field plate 94, the outer circumferential gate runner 130, and the emitter electrode 52 is covered with a protective film such as a polyimide or nitride film, the protective film may be omitted in the drawings of the present specification.

The second high concentration region 202 is an N type region having a donor concentration higher than the doping concentration of the bulk donor. The second high concentration region 202 is provided between two adjacent guard rings 92. The second high concentration region 202 may be in contact with the upper surface 21 of the semiconductor substrate 10. The second high concentration region 202 of the this example is provided in a range shallower than the lower end of the guard ring 92 from the upper surface 21. In another example, the second high concentration region 202 may be provided to a position deeper than the lower end of guard ring 92. The second high concentration region 202 may also be provided between the well region 11 and the guard ring 92.

The second high concentration region 202 may be formed by implanting a donor from the upper surface 21 of the semiconductor substrate 10 using the field plate 94 as a mask and performing heat treatment. In this case, at least a part of the second high concentration region 202 is formed in a region not covered with the field plate 94. At least a part of the second high concentration region 202 of the this example does not overlap the field plate 94 in the Z axis direction. The donor to be implanted into the second high concentration region 202 may be phosphorous, hydrogen, or another donor. In a case where the second high concentration region 202 is formed deep, the donor may be implanted into a plurality of depth positions by varying the acceleration energy of the donor.

In another example, the second high concentration region 202 may be formed by implanting the donor from the upper surface 21 of the semiconductor substrate 10 without using the field plate 94 as a mask and performing heat treatment. In this case, boron is selectively ion-implanted as a P type dopant, and the guard ring is formed by heat treatment. Thereafter, phosphorous is ion-implanted as an N type dopant, and the second high concentration region 202 is formed by heat treatment. The temperature of the heat treatment after the implantation of the P type dopant is higher than the temperature of the heat treatment after the implantation of the N type dopant. The dosing amount in the ion implantation of the N type dopant may be lower than the dosing amount of the P type dopant. In this case, the ion implantation of the N type dopant may also be implanted into the region forming the guard ring, or may be selectively implanted so as to avoid the region forming the guard ring.

In the example of FIG. 11, the second high concentration region 202 and the high concentration region 460 are arranged away from each other in the Z axis direction. A region having the same donor concentration as the bulk donor concentration may be provided between the second high concentration region 202 and the high concentration region 460.

Note that, if the heat treatment is performed at a high temperature for a long time after hydrogen is implanted, the hydrogen donor disappears or the lifetime adjustment function at the first peak 401 disappears. Therefore, it is preferable that the implantation of hydrogen and the heat treatment step are performed at the end of the manufacturing step of the semiconductor device 100. For example, by implanting hydrogen after forming a protective film above the field plate 94 or the like, the disappearance of hydrogen donors can be suppressed.

If the doping concentration on the upper surface 21 side of the edge termination structure portion 90 varies, the degree of expanding of the depletion layer in the edge termination structure portion 90 also varies. In a case where the second high concentration region 202 and the high concentration region 460 are not provided, the bulk doping region 18 of the bulk donor concentration occupies a large region on the upper surface 21 side of the edge termination structure portion 90. Since the bulk donor concentration is the concentration of the donor contained from the time of manufacturing the semiconductor substrate 10, variation is relatively likely to occur.

On the other hand, the second high concentration region 202 and the high concentration region 460 are formed by the implantation of ions or the like. Since the concentration of the implantation of ions is relatively easily controlled, the variation in donor concentration between the second high concentration region 202 and the high concentration region 460 is relatively small. Therefore, by providing the second high concentration region 202 and the high concentration region 460, it is possible to reduce the variation in the degree of expanding in the X axis direction of the depletion layer extending from below the well region 11 to the edge termination structure portion 90, and it is also possible to reduce the variation in the breakdown voltage of the semiconductor device 100. In addition, by providing the second high concentration region 202 and the high concentration region 460, it is possible to prevent the depletion layer from expanding too much in the X axis direction in the edge termination structure portion 90.

Figure 12:
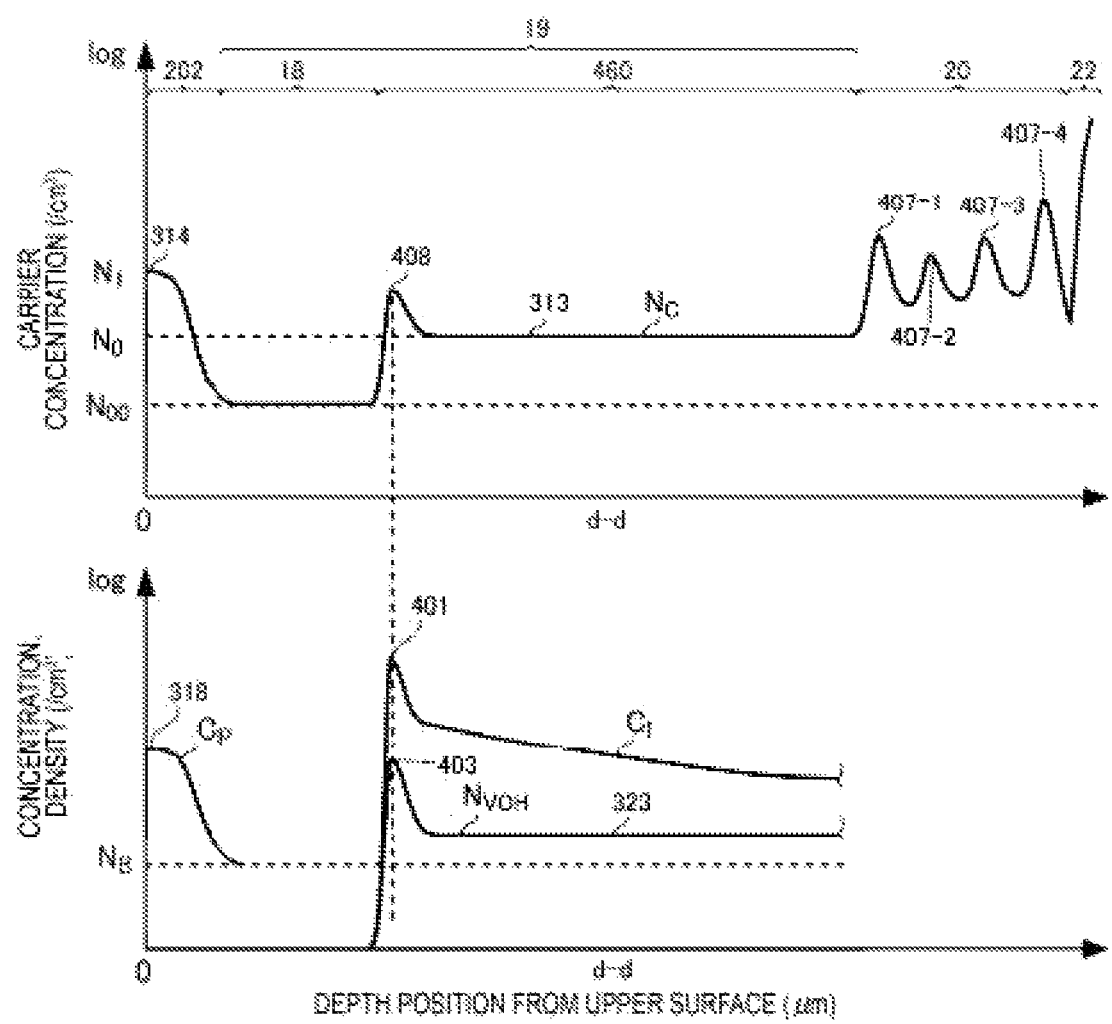
FIG. 12 illustrates distribution examples of a carrier concentration $N_c$, a phosphorous chemical concentration $C_P$, a VOH defect concentration $N_{VOH}$, and an impurity chemical concentration $C_I$ along the d-d line illustrated in FIG. 11.

FIG. 12 illustrates the distribution examples of the carrier concentration $N_c$, the phosphorous chemical concentration $C_P$, the VOH defect concentration $N_{VOH}$, and the impurity chemical concentration $C_I$ along the d-d line illustrated in FIG. 11. The impurity of the this example is hydrogen. That is, the impurity chemical concentration $C_I$ indicates a hydrogen chemical concentration. The d-d line passes through the second high concentration region 202, the bulk doping region 18, the high concentration region 460, the buffer region 20, and the collector region 22 in the edge termination structure portion 90. The carrier concentration distribution may be the same as the net doping concentration distribution.

In the this example, the bulk donor is phosphorous. In addition, the second high concentration region 202 is formed by implanting phosphorous from the upper surface 21 of the semiconductor substrate 10. In the this example, the bulk donor concentration is $N_B$. The bulk donor concentration is substantially uniform throughout the depth direction. As the bulk donor concentration, a minimum value of the concentration of donors distributed throughout the semiconductor substrate 10 may be used. For example, in a case where phosphorous is distributed over the entire semiconductor substrate 10, the bulk donor concentration may be the minimum value of the phosphorous concentration in the semiconductor substrate 10.

The phosphorous concentration distribution in the second high concentration region 202 has a phosphorous concentration peak 318 at which the phosphorous concentration becomes a local maximum value. The depth position of the phosphorous concentration peak 318 corresponds to the phosphorous implantation position. The hydrogen chemical concentration in the high concentration region 460 has a local maximum value at the first peak 401.

The VOH defect density distribution may be a distribution reflecting the hydrogen chemical concentration distribution or a distribution similar to the hydrogen chemical concentration distribution. For example, the positions of inflection points such as local maximum, local minimum, and kink of each distribution may be arranged at approximately the same depth position. Approximately the same depth position may have an error smaller than the full width at half maximum of the first peak 401, for example.

The carrier concentration distribution of the this example has a peak 408 at the same depth position as the first peak 401. In the second high concentration region 202, a peak 314 is present at the same depth position as the phosphorous concentration peak 318. In a case where the distance between the peaks 408 and 314 is sufficiently large, the bulk doping region 18 having a base carrier concentration $N_{00}$ according to the bulk donor concentration $N_B$ is provided between the peaks 314 and 408.

The high concentration region 460 may have a flat portion 313 having a substantially uniform carrier concentration between the first peak 401 and the buffer region 20. In the flat portion 313, the carrier concentration may vary in a range from a minimum value $N_0$ of the carrier concentration between the first peak 401 and the buffer region 20 to 2 times or less of the minimum value $N_0$. In the flat portion 313, the carrier concentration may vary in a range of the minimum value $N_0$ or more and 1.5 times or less of the minimum value $N_0$, and the carrier concentration may vary in a range of the minimum value $N_0$ or more and 1.2 times or less of the minimum value $N_0$. The length of the flat portion 313 in the Z axis direction may be half or more of the length of the high concentration region 460 in the Z axis direction. In the high concentration region 460, the carrier concentration may gradually decrease from the peak 408 toward the buffer region 20.

The distribution of the VOH defect concentration $N_{VOH}$ may also have a flat portion 323 at the same depth position as the flat portion 313. In the flat portion 323, similarly to the flat portion 313, the VOH defect density may vary in a range from a minimum value or more of the VOH defect density between the first peak 401 and the buffer region 20 to 2 times or less of the minimum value. In the flat portion 323, the VOH defect density may vary in a range from the minimum value or more to 1.5 times or less of the minimum value, and the VOH defect density may vary in a range from the minimum value or more to 1.2 times or less of the minimum value. The length of the flat portion 323 in the Z axis direction may be half or more of the length of the high concentration region 460 in the Z axis direction.

A peak value $N_1$ of the carrier concentration in the second high concentration region 202 is larger than the minimum value $N_0$ of the carrier concentration in the high concentration region 460. The peak value $N_1$ may be 2 times or more, 5 times or more, or 10 times or more of the minimum value $N_0$. The peak value $N_1$ may be 10 times or more, or 100 times or more of the base carrier concentration $N_{00}$.

The buffer region 20 of the this example has a plurality of donor concentration peaks 407 having different depth positions. At least one donor concentration peak 407 may be the concentration peak of the hydrogen donor. That is, a peak of the hydrogen chemical concentration may be provided at the same depth position as the donor concentration peak 407. The peak of the hydrogen chemical concentration functions as the second peak 402 described in FIG. 2 and the like. All the donor concentration peaks 407 may be hydrogen donor concentration peaks.

Figure 13A:
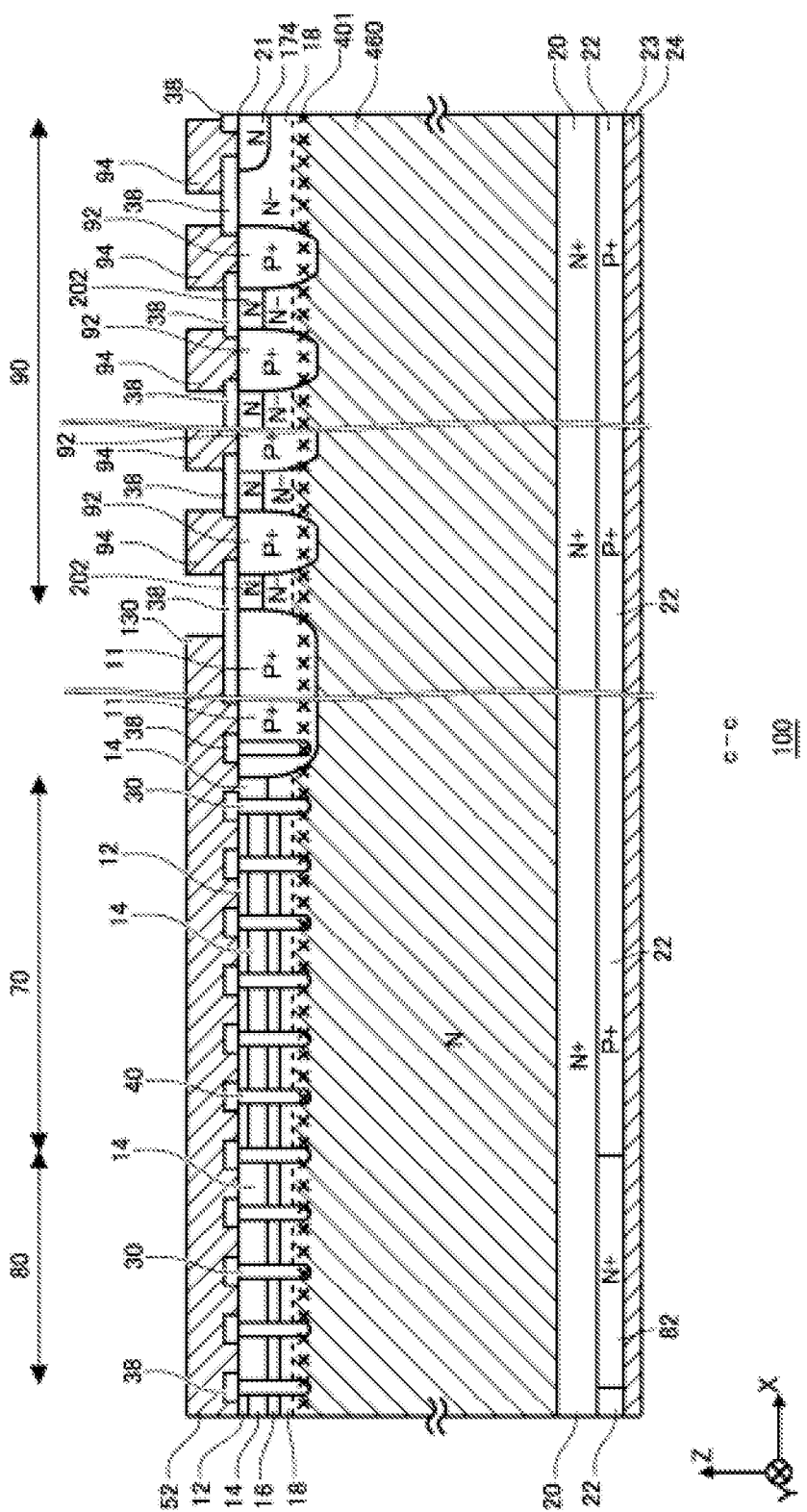
FIG. 13A illustrates a diagram showing another example of the cross section c-c in FIG. 8.

FIG. 13A illustrates a diagram showing another example of the cross section c-c in FIG. 8. The semiconductor device 100 of the this example is different from the example illustrated in FIG. 11 in the range in the depth direction in which the high concentration region 460 is provided. The position of the first peak 401 in the depth direction may also be different from the example illustrated in FIG. 11. Other structures are the same as those in the example illustrated in FIG. 11.

The high concentration region 460 in the this example is in contact with the guard ring 92. The high concentration region 460 includes at least a lower end of the guard ring 92. The high concentration region 460 may also be provided between two guard rings 92 adjacent to each other. The high concentration region 460 of the this example is not in contact with the second high concentration region 202. The high concentration region 460 may be provided on the upper surface 21 side with respect to the bottom surface of the trench portion. That is, the high concentration region 460 may be provided up to the mesa portion sandwiched between the adjacent trench portions. The bulk doping region 18 of bulk donor concentration may be provided between the high concentration region 460 and the second high concentration region 202.

The first peak 401 of the this example is in contact with the guard ring 92. That is, the first peak 401 is arranged above the lower end of the guard ring 92.

According to the this example, since the high concentration region 460 covers the lower end of the guard ring 92, it is possible to reduce the variation in the donor concentration in the region where the electric field is likely to concentrate. Therefore, the variation in the breakdown voltage can be further reduced.

Figure 13B:
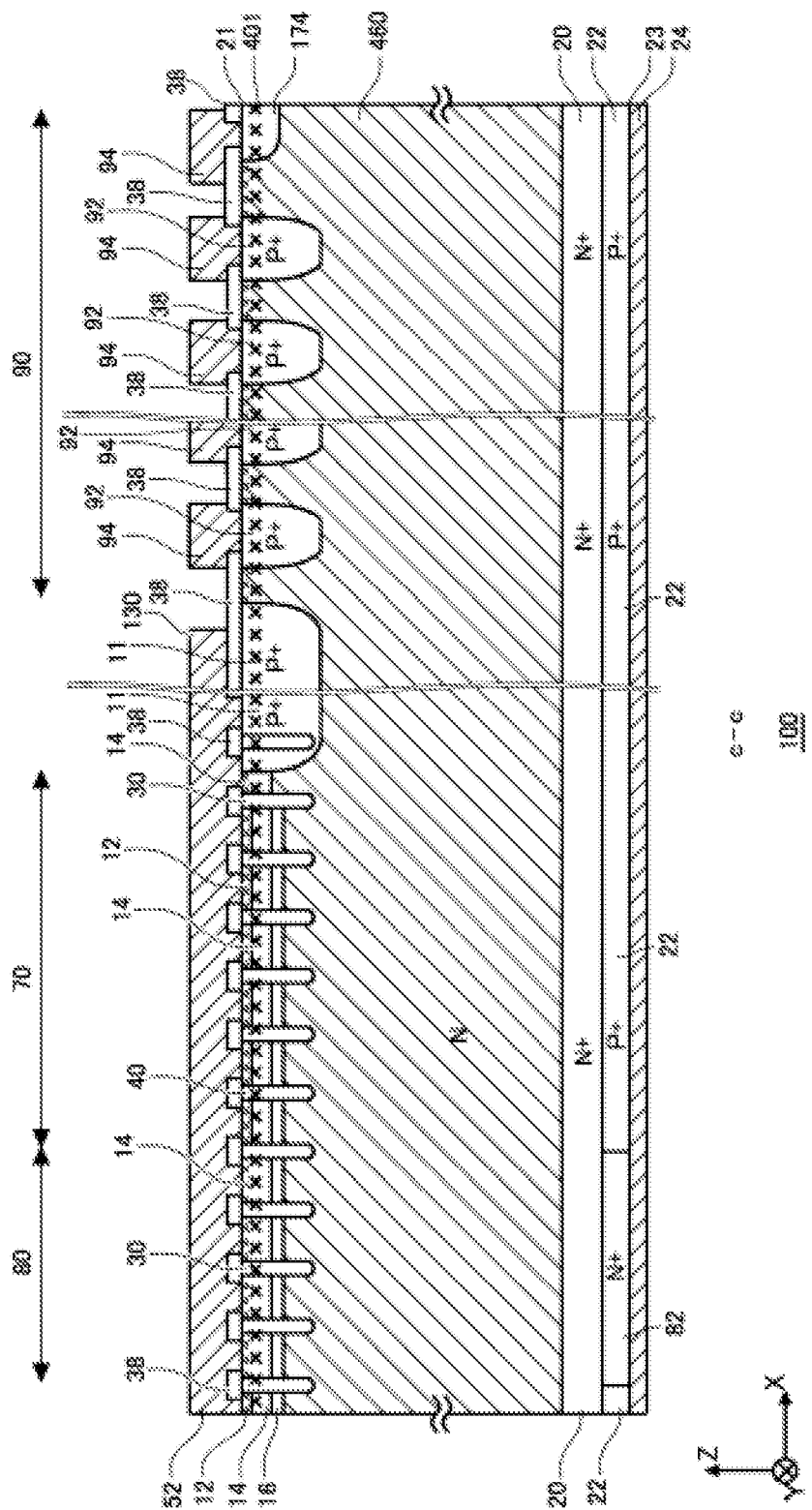
FIG. 13B illustrates a diagram showing another example of the cross section c-c in FIG. 8.

FIG. 13B illustrates a diagram showing another example of the cross section c-c in FIG. 8. The semiconductor device 100 of the this example is different from the example illustrated in FIG. 13A in the range in the depth direction in which the high concentration region 460 is provided. The position of the first peak 401 in the depth direction may also be different from the example illustrated in FIG. 13A. Other structures may be the same as the example illustrated in FIG. 13A.

The channel stopper 174 of the this example contains hydrogen. In the this example, the first peak 401 is arranged at a depth position overlapping the channel stopper 174. Similarly, the peak of the hydrogen chemical concentration is arranged at a position overlapping the channel stopper 174. That is, hydrogen is distributed from the lower surface 23 of the semiconductor substrate 10 to the depth position overlapping the channel stopper 174. Hydrogen may be contained in the emitter region 12, the contact region 15, the base region 14, or the accumulation region 16. The first peak 401 may overlap the emitter region 12, the contact region 15, the base region 14, or the accumulation region 16.

The high concentration region 460 is provided up to the depth position overlapping the channel stopper 174. The high concentration region 460 may be provided up to the upper surface 21 of the semiconductor substrate 10, or may be provided up to a position below the upper surface 21. In the region sandwiched by the two guard rings 92, the second high concentration region 202 may be provided between the high concentration region 460 and the upper surface 21, and the bulk doping region 18 may be provided.

In a region below the channel stopper 174 of the this example, the high concentration region 460 is provided, and the bulk doping region 18 does not remain. Therefore, it is possible to suppress the depletion layer expanding in the X axis direction from extending to the outside of the channel stopper 174.

Figure 13C:
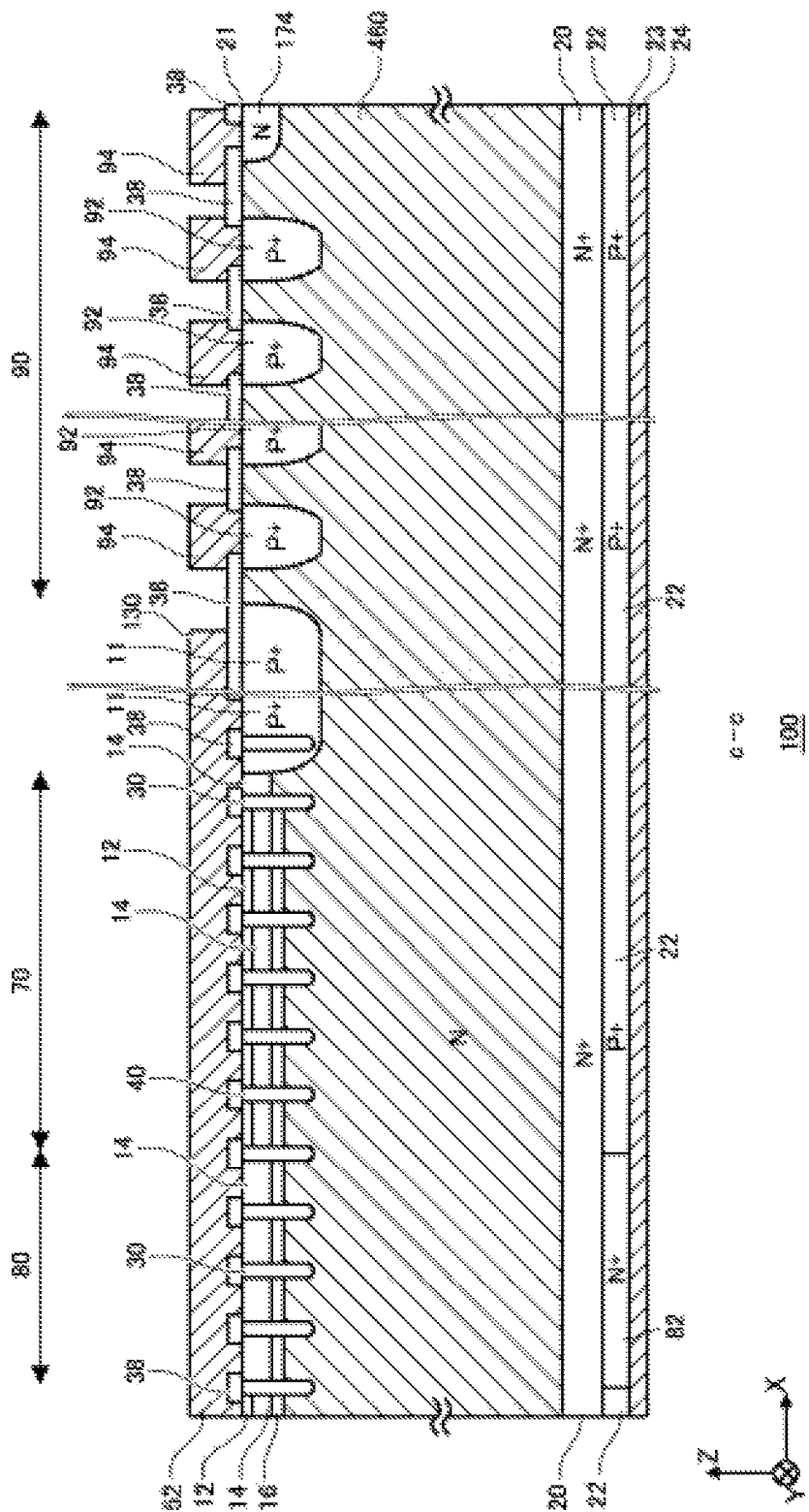
FIG. 13C illustrates a diagram showing another example of the cross section c-c in FIG. 8.

FIG. 13C illustrates a diagram showing another example of the cross section c-c in FIG. 8. The semiconductor device 100 of the this example is different from the example illustrated in FIG. 13A or FIG. 13B in the range in the depth direction in which the high concentration region 460 is provided. In addition, the first peak 401 does not exist in the semiconductor substrate 10. Other structures may be the same as the examples illustrated in FIG. 13A or FIG. 13B.

In the this example, impurities (hydrogen) are implanted from the lower surface 23 or the upper surface 21 of the semiconductor substrate 10 so as to penetrate the semiconductor substrate 10. That is, the acceleration energy of hydrogen ions is adjusted so that the range of hydrogen ions is larger than the thickness of the semiconductor substrate 10. Therefore, the first peak 401 is not provided in the semiconductor substrate 10. At the time of hydrogen ion implantation, an absorber such as a shielding member 350 described later may be used or may not be used.

The high concentration region 460 is formed from the lower surface 23 to the upper surface 21 of the semiconductor substrate 10. In the this example, the second high concentration region 202 may not be provided, and the second high concentration region 202 may be provided so as to overlap the high concentration region 460.

In a region below the channel stopper 174 of the this example, the high concentration region 460 is provided, and the bulk doping region 18 does not remain. Therefore, it is possible to suppress the depletion layer expanding in the X axis direction from extending to the outside of the channel stopper 174. In addition, since the first peak 401 does not exist, the influence on the doping region (for example, the emitter region 12, the base region 14, the contact region 15, the accumulation region 16, the well region 11, and the guard ring 92) locally provided on the upper surface 21 side of the semiconductor substrate 10 can be reduced.

Figure 14:
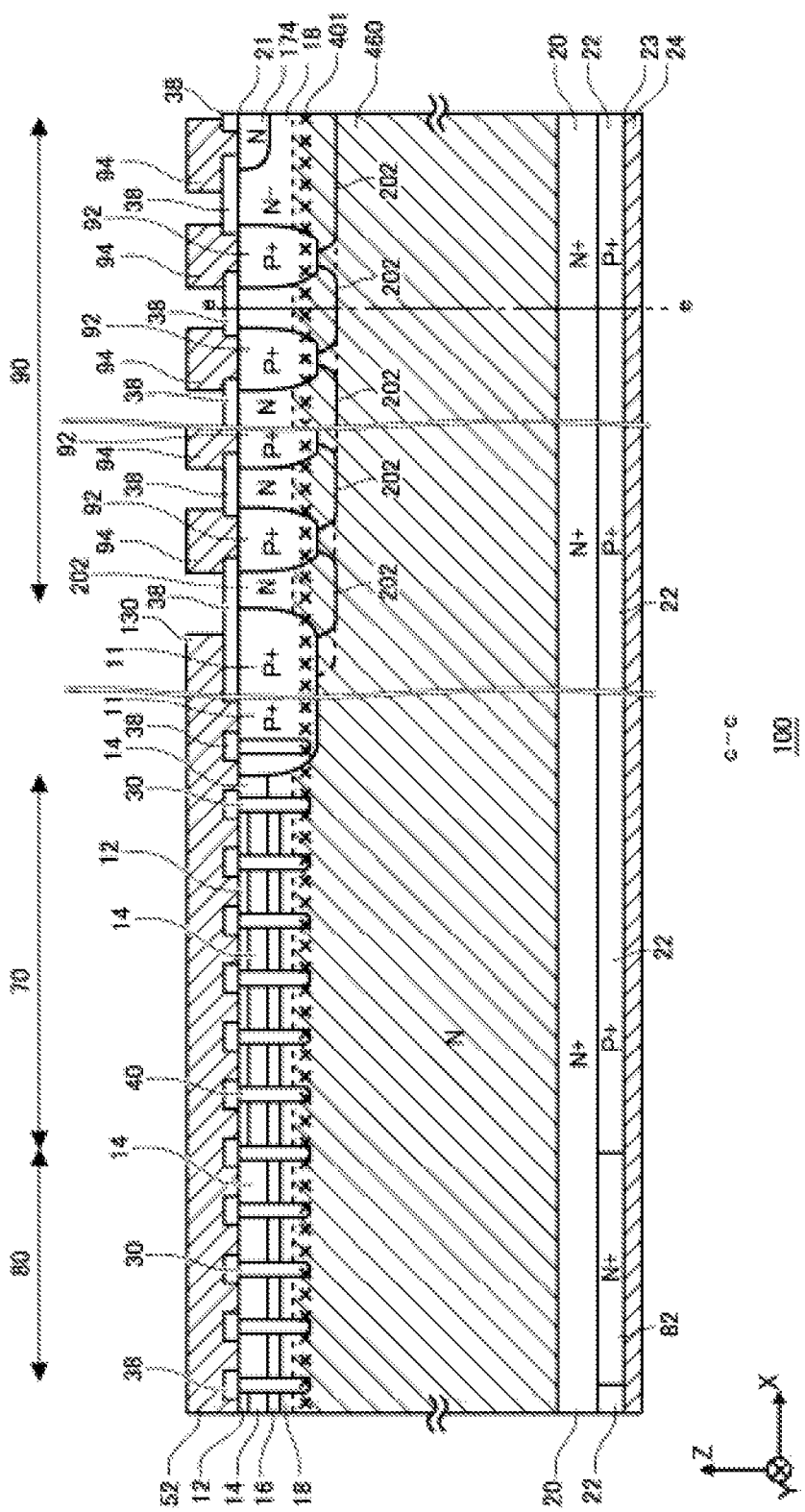
FIG. 14 illustrates a diagram showing another example of the cross section c-c in FIG. 8.

FIG. 14 illustrates a diagram showing another example of the cross section c-c in FIG. 8. The semiconductor device 100 of the this example is different from the example illustrated in FIG. 11, FIG. 13A, FIG. 13B, or FIG. 13C in the range in the depth direction in which the second high concentration region 202 and the high concentration region 460 are provided. Other structures are the same as the example illustrated in FIG. 11, FIG. 13A, FIG. 13B, or FIG. 13C.

A part of the second high concentration region 202 and a part of the high concentration region 460 of the this example are provided in the same region. The lower end of the second high concentration region 202 is arranged within the range of the high concentration region 460, and the upper end of the high concentration region 460 is arranged within the range of the second high concentration region 202. With this configuration, the region of the bulk donor concentration in the edge termination structure portion 90 can be reduced by connecting the second high concentration region 202 and the high concentration region 460. Therefore, the variation in breakdown voltage can be further reduced.

The second high concentration region 202 may be formed to a position deeper than the lower end of the guard ring 92. As a result, the second high concentration region 202 and the high concentration region 460 can be easily connected. In another example, the second high concentration region 202 may be formed up to a position shallower than the lower end of the guard ring 92. The first peak 401 of the this example is arranged in the second high concentration region 202. The first peak 401 may be provided at a position in contact with the guard ring 92. As a result, the high concentration region 460 can be formed up to the proximity of the upper surface 21, and the second high concentration region 202 and the high concentration region 460 can be easily connected.

In the edge termination structure portion 90, the bulk doping region 18 having the bulk donor concentration may remain or the second high concentration region 202 may be provided without the bulk doping region 18 remaining, further outside the outermost guard ring 92. In the this example, the bulk doping region does not remain. In the example of FIG. 14, the second high concentration region 202 does not cover a part of the lower end of the guard ring 92. As indicated by a broken line in FIG. 14, the second high concentration region 202 may cover entire guard ring 92.

Figure 15:
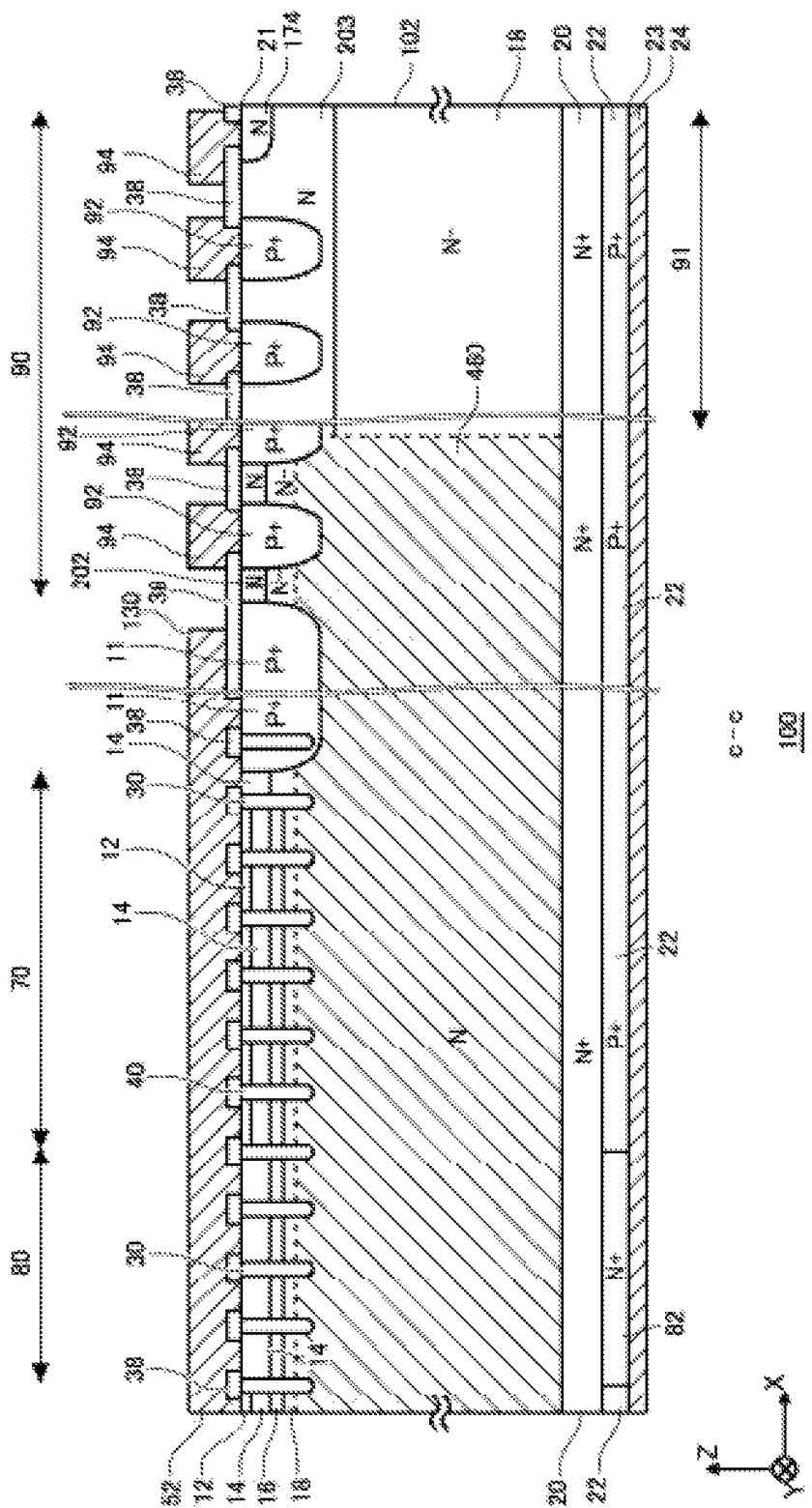
FIG. 15 illustrates a diagram showing another example of the cross section c-c in FIG. 8.

FIG. 15 illustrates a diagram showing another example of the cross section c-c in FIG. 8. In the semiconductor device 100 of the this example, the arrangement of the high concentration regions 460 in at least a part of the region 91 of the edge termination structure portion 90 is different from that of the example illustrated in FIG. 11, FIG. 13A, FIG. 13B, FIG. 13C, or FIG. 14. In the region 91, a third high concentration region 203 may be provided instead of the second high concentration region 202. The third high concentration region 203 is a high concentration region formed to a position deeper than the second high concentration region 202. One or more of the bulk doping region 18, the second high concentration region 202, the high concentration region 460, and the third high concentration region 203 may be provided in the region 91. Other structures are the same as the example illustrated in FIG. 11, FIG. 13A, FIG. 13B, FIG. 13C, or FIG. 14.

The high concentration region 460 in FIG. 15 is not provided in the region 91 having a predetermined width in contact with the end side 102 of the semiconductor substrate 10 in the edge termination structure portion 90. The region 91 may include one or more guard rings 92. The region 91 may be provided with the bulk doping region 18 of the bulk donor concentration instead of the high concentration region 460. The high concentration region 460 may not be formed in the edge termination structure portion 90. The outer circumferential end of the high concentration region 460 may be located on the inner peripheral side of the guard ring 92 located on the innermost periphery. In another example, the high concentration region 460 may also be provided in the region 91. The high concentration region 460 in the region 91 may have the same, shorter, or longer length in the Z axis direction than the high concentration region 460 arranged inside the region 91.

The edge termination structure portion 90 inside the region 91 has the same structure as the example illustrated in FIG. 11, FIG. 13A, FIG. 13B, FIG. 13C, or FIG. 14. The edge termination structure portion 90 inside the region 91 includes one or more guard rings 92. As illustrated in FIG. 11, FIG. 13A, FIG. 13B, FIG. 13C, or FIG. 14, the high concentration region 460 may be provided in a range including the lower end of guard ring 92, or may be provided in a range not including the lower end of the guard ring 92.

The second high concentration region 202 may or may not be provided in the region 91. Alternatively, instead of the second high concentration region 202, an N type third high concentration region 203 having a donor concentration higher than the bulk donor concentration may be provided. The donor concentration in the third high concentration region 203 may be the same as or different from the donor concentration in the second high concentration region 202. The third high concentration region 203 is provided from the upper surface 21 of the semiconductor substrate 10 to a position deeper than the lower end of the second high concentration region 202. The third high concentration region 203 of the this example may be provided up to a position deeper than the lower end of the guard ring 92. The bulk doping region 18 is provided between the third high concentration region 203 and the buffer region 20.

The third high concentration region 203 may be formed by implanting a donor such as phosphorous or hydrogen from the upper surface 21. The implantation depth of the donor in the third high concentration region 203 may be deeper than the implantation depth of the donor in the second high concentration region 202. The heat treatment for the second high concentration region 202 and the third high concentration region 203 may be performed individually or in common.

Figure 16:
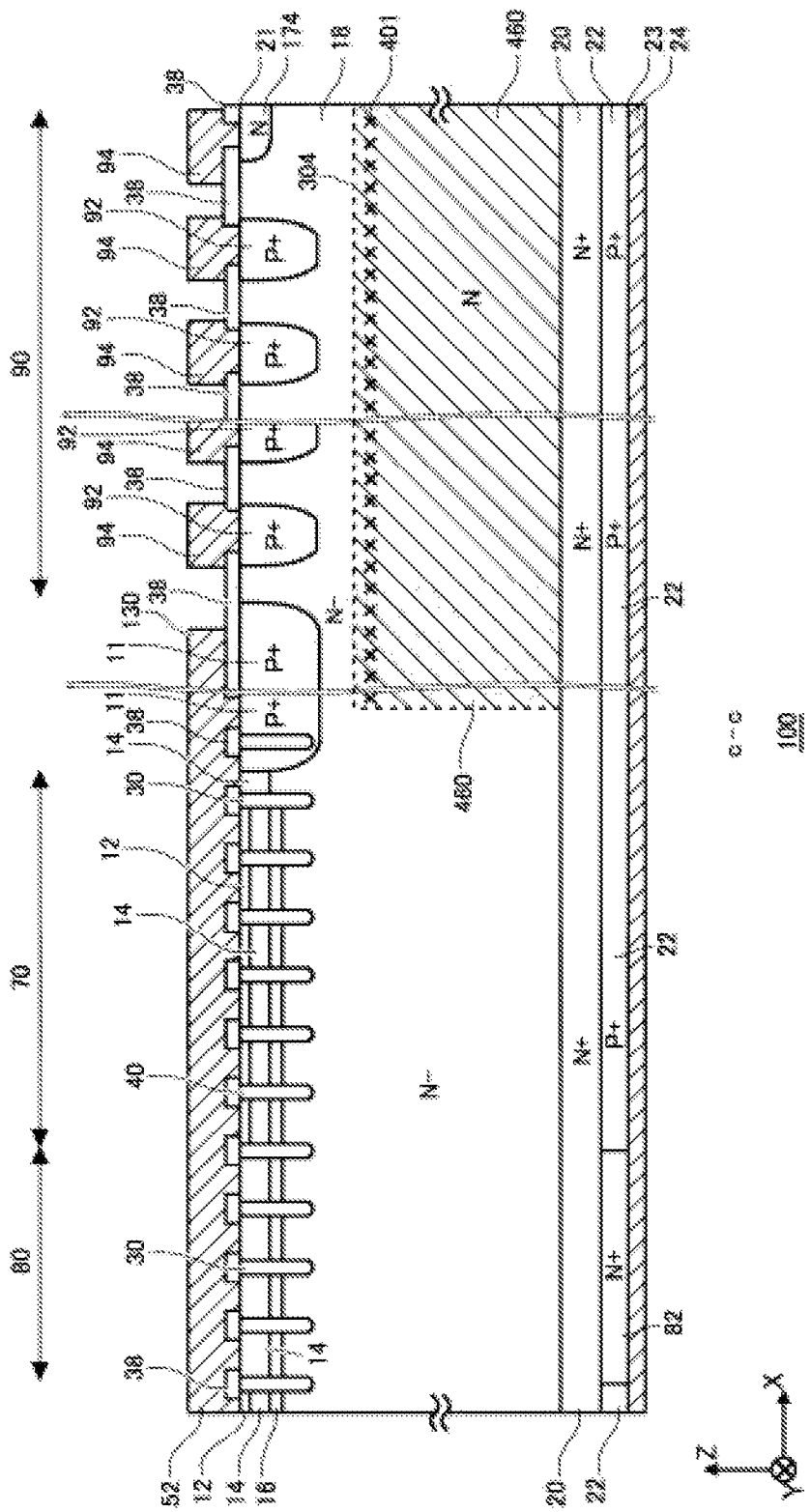
FIG. 16 illustrates a diagram showing another example of the cross section c-c in FIG. 8.

FIG. 16 illustrates a diagram showing another example of the cross section c-c in FIG. 8. The semiconductor device 100 of the this example is different from the semiconductor device 100 described in FIG. 1 to FIG. 15 in the range in the XY plane in which the high concentration region 460 is provided. The range in the XY plane in which the first peak 401 is provided may also be different from the example described in FIG. 1 to FIG. 15. The structure other than the high concentration region 460 and the first peak 401 may be the same as any aspect described in FIG. 1 to FIG. 15. In FIG. 16, the arrangement of the high concentration region 460 and the first peak 401 is different from that of the example illustrated in FIG. 11. In addition, in the example illustrated in FIG. 16, the second high concentration region 202 is not provided as compared with the example illustrated in FIG. 11. Other structures are the same as those in the example illustrated in FIG. 11.

The high concentration region 460 of the this example is at least partially provided in the edge termination structure portion 90 and is provided in a range not reaching the active portion 160. The high concentration region 460 may be provided only in the edge termination structure portion 90, or may be provided from the edge termination structure portion 90 to below the well region 11. In the example of FIG. 16, the high concentration region 460 is provided from the end portion of the semiconductor substrate 10 in the X axis direction to below the well region 11.

In the this example, since the high concentration region 460 is not provided in the active portion 160, characteristic variation of the active portion 160 due to the provision of the high concentration region 460 can be prevented. Since the high concentration region 460 is provided in the edge termination structure portion 90, the expanding of the depletion layer in the edge termination structure portion 90 can be suppressed, and the area of the edge termination structure portion 90 in the XY plane can be reduced.

Figure 17:
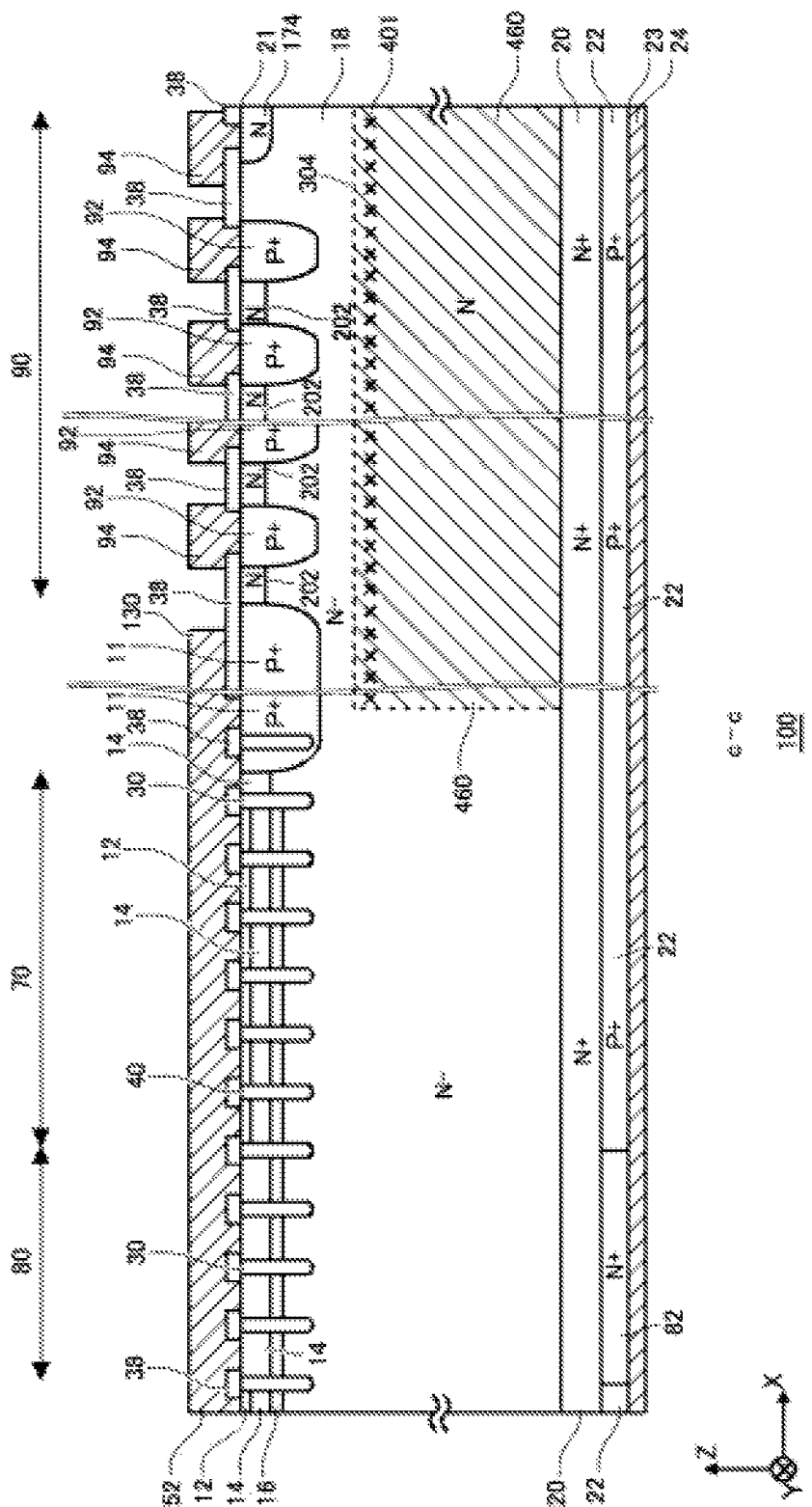
FIG. 17 illustrates a diagram showing another example of the cross section c-c in FIG. 8.

FIG. 17 illustrates a diagram showing another example of the cross section c-c in FIG. 8. The semiconductor device 100 of the this example is different from the example described in FIG. 16 in that the second high concentration region 202 is provided. Other structures are the same as those of the semiconductor device 100 of any aspect described in FIG. 16. Also in the this example, it is possible to suppress the expanding of the depletion layer in the edge termination structure portion 90 while preventing the characteristic variation of the active portion 160.

Figure 18A:
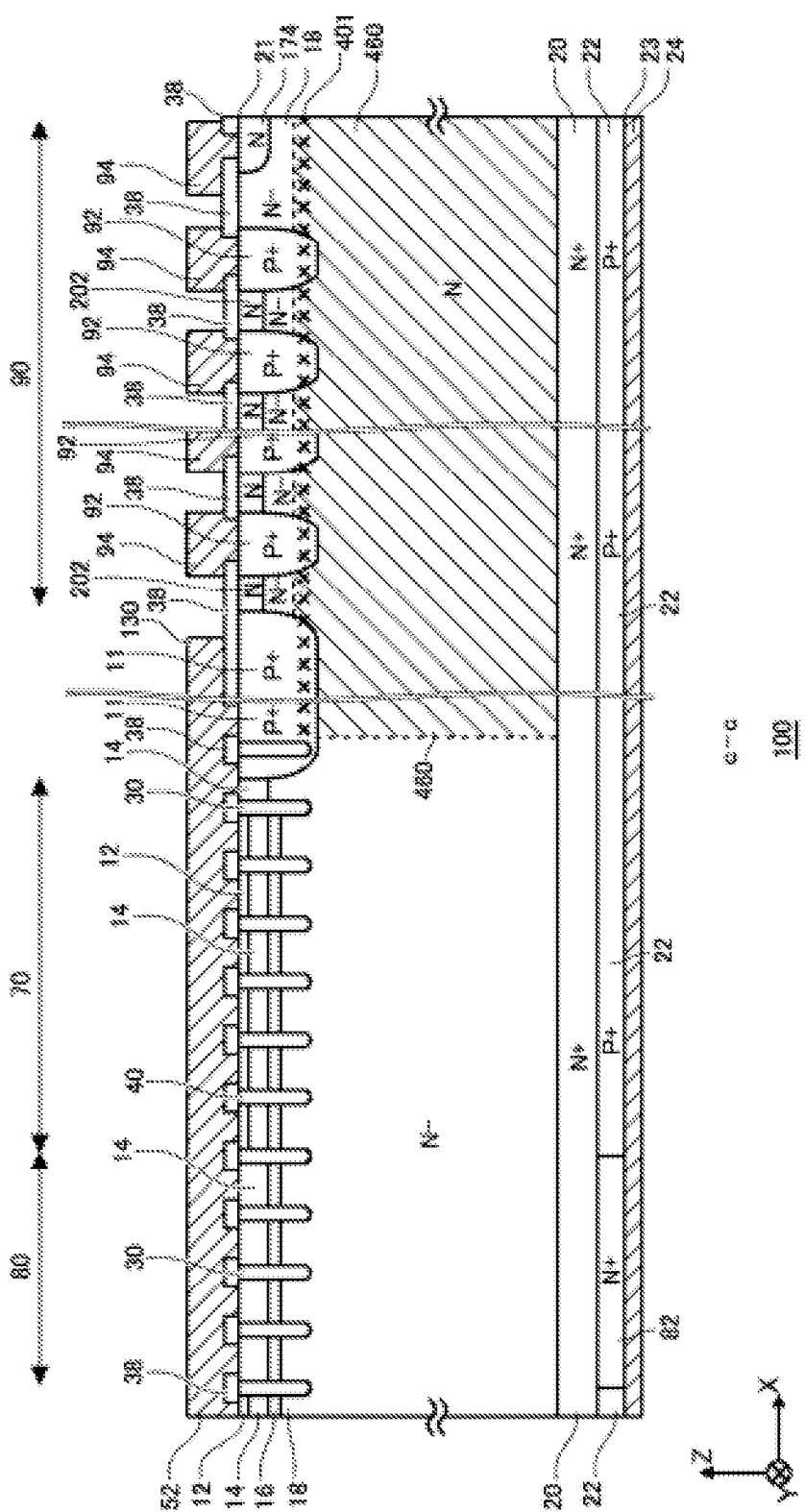
FIG. 18A illustrates a diagram showing another example of the cross section c-c in FIG. 8.

FIG. 18A illustrates a diagram showing another example of the cross section c-c in FIG. 8. In the semiconductor device 100 of the this example, the upper end position of the high concentration region 460 in the Z axis direction and the position of the first peak 401 in the Z axis direction are different from those in the example described with reference to FIG. 16 or FIG. 17. Other structures are the same as any of the examples described in FIG. 16 or FIG. 17. In the example illustrated in FIG. 18A, as in the example of FIG. 17, the second high concentration region 202 is provided. The upper end position of the high concentration region 460 in the Z axis direction and the position of the first peak 401 in the Z axis direction are the same as those in the example described in FIG. 13A. Also in the this example, it is possible to suppress the expanding of the depletion layer in the edge termination structure portion 90 while preventing the characteristic variation of the active portion 160.

Figure 18B:
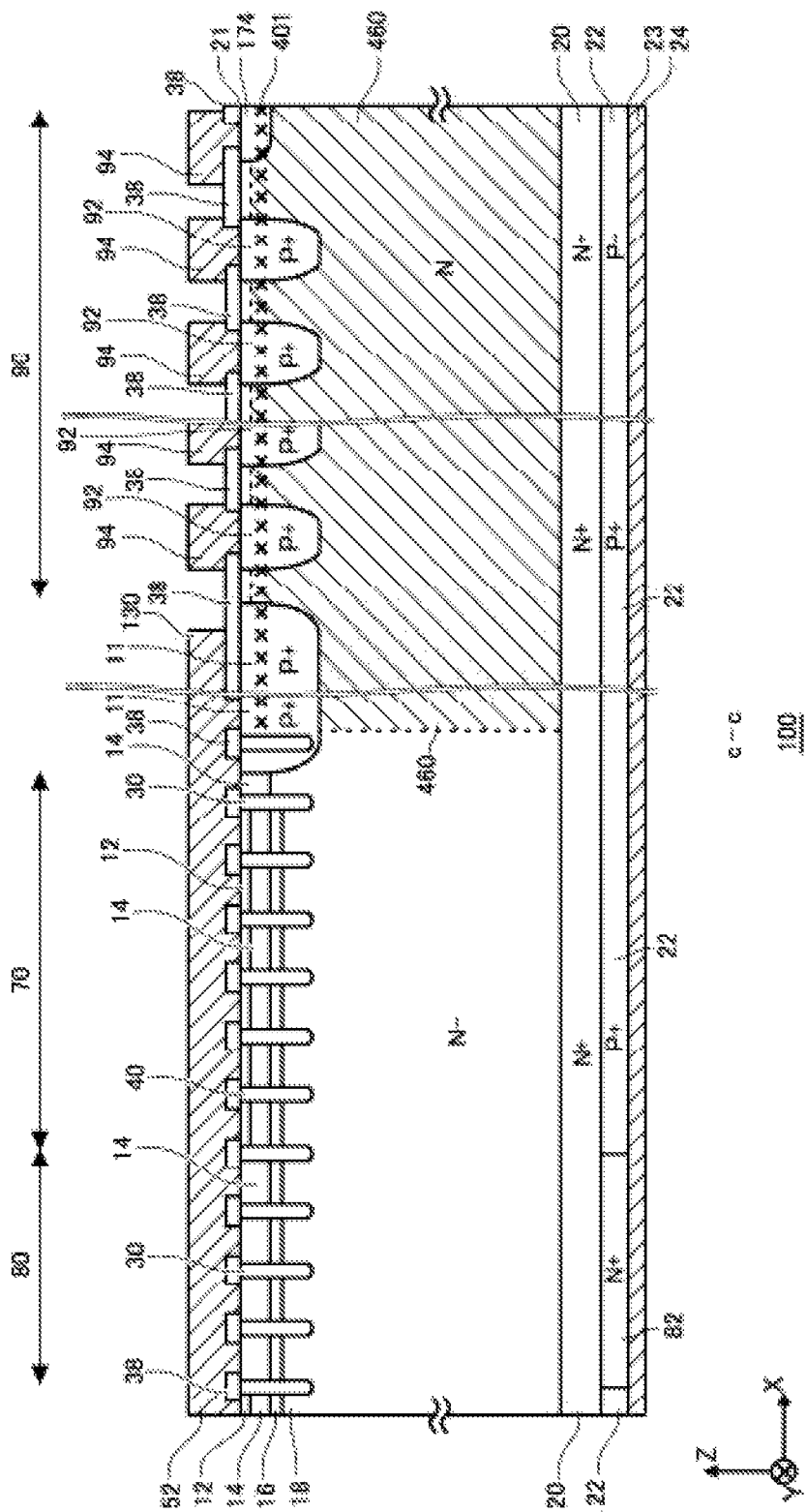
FIG. 18B illustrates a diagram showing another example of the cross section c-c in FIG. 8.

FIG. 18B illustrates a diagram showing another example of the cross section c-c in FIG. 8. The semiconductor device 100 of the this example is different from the example illustrated in FIG. 18A in the range in the depth direction in which the high concentration region 460 is provided. The position of the first peak 401 in the depth direction may also be different from the example illustrated in FIG. 18A. Other structures may be the same as the example illustrated in FIG. 18A.

In the this example, the range in which the high concentration region 460 is provided and the depth position in which the first peak 401 is provided are similar to those in the example of FIG. 13B. That is, the first peak 401 of the this example is arranged at a depth position overlapping the channel stopper 174. Similarly, the peak of the hydrogen chemical concentration is arranged at a position overlapping the channel stopper 174. The high concentration region 460 of the this example is provided up to a depth position overlapping the channel stopper 174.

In a region below the channel stopper 174 of the this example, the high concentration region 460 is provided, and the bulk doping region 18 does not remain. Therefore, it is possible to suppress the depletion layer expanding in the X axis direction from extending to the outside of the channel stopper 174.

Figure 18C:
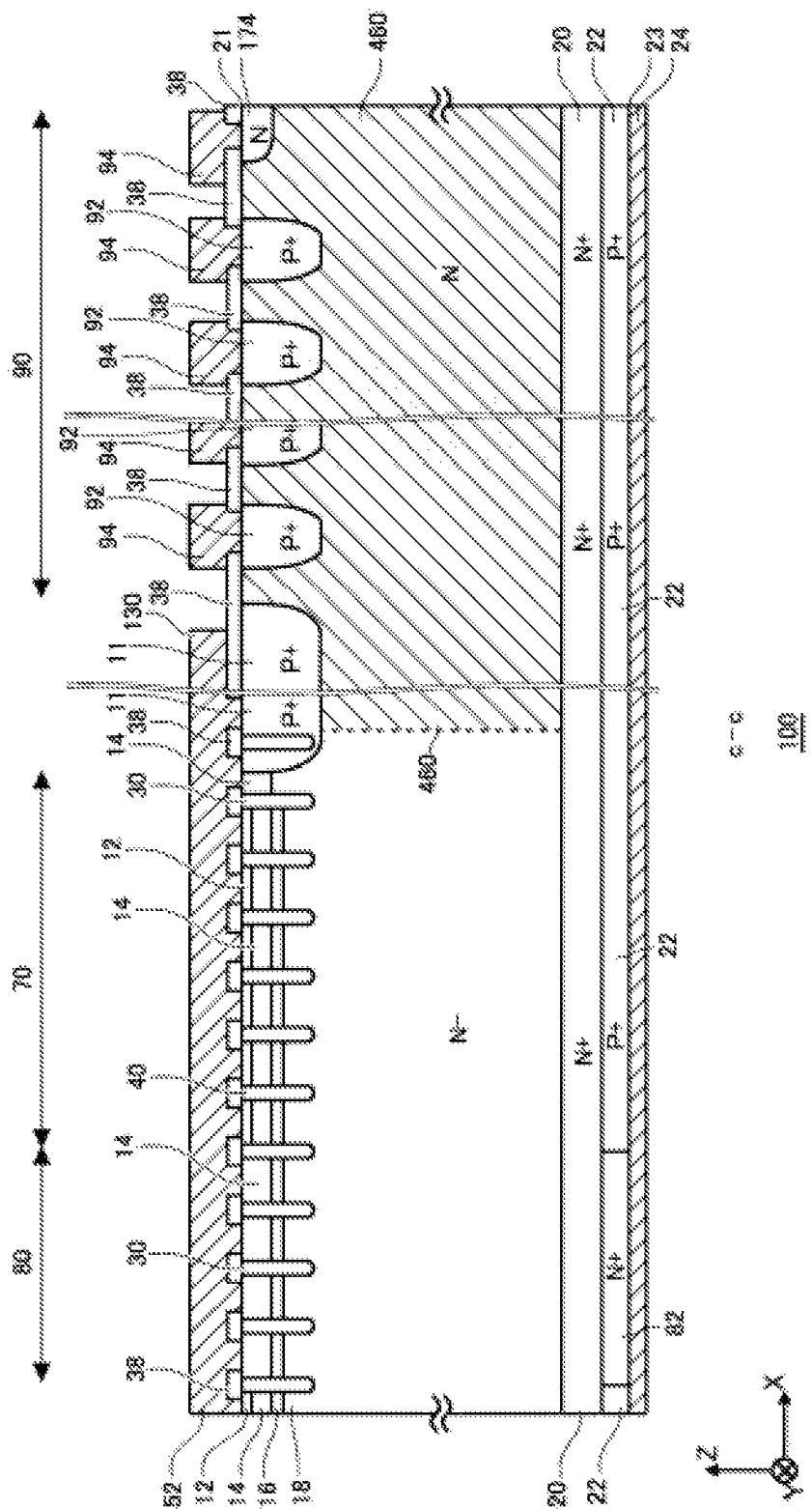
FIG. 18C illustrates a diagram showing another example of the cross section c-c in FIG. 8.

FIG. 18C illustrates a diagram showing another example of the cross section c-c in FIG. 8. The semiconductor device 100 of the this example is different from the example illustrated in FIG. 18A or FIG. 18B in the range in the depth direction in which the high concentration region 460 is provided. In addition, the first peak 401 does not exist in the semiconductor substrate 10. Other structures may be the same as the examples illustrated in FIG. 18A or FIG. 18B.

In the this example, as in the example of FIG. 13C, impurities (hydrogen) are implanted from the lower surface 23 of the semiconductor substrate 10 so as to penetrate the semiconductor substrate 10. In the this example, the depth range in which the high concentration region 460 is provided is similar to that in the example of FIG. 13 C. That is, the high concentration region 460 is formed from the lower surface 23 to the upper surface 21 of the semiconductor substrate 10.

In a region below the channel stopper 174 of the this example, the high concentration region 460 is provided, and the bulk doping region 18 does not remain. Therefore, it is possible to suppress the depletion layer expanding in the X axis direction from extending to the outside of the channel stopper 174. In addition, since the first peak 401 does not exist, the influence on the doping region (for example, the well region 11 and the guard ring 92) locally provided on the upper surface 21 side of the semiconductor substrate 10 can be reduced.

Figure 19:
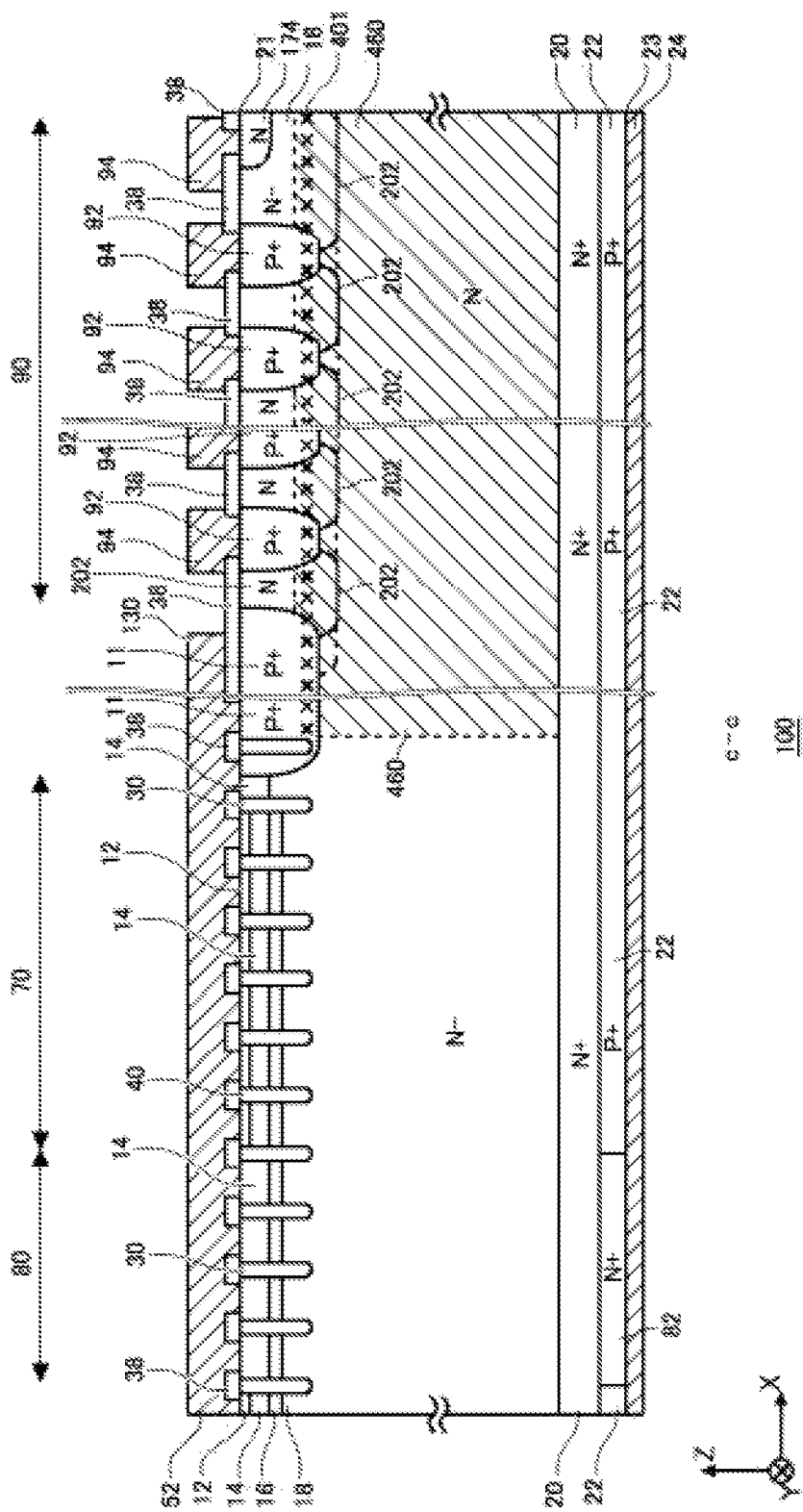
FIG. 19 illustrates a diagram showing another example of the cross section c-c in FIG. 8.

FIG. 19 illustrates a diagram showing another example of the cross section c-c in FIG. 8. The semiconductor device 100 of the this example is different from the example illustrated in FIG. 18A, FIG. 18B, or FIG. 18C in the structure of the second high concentration region 202. Other structures are the same as the examples illustrated in FIG. 18A, FIG. 18B, or FIG. 18C. The second high concentration region 202 of the this example has the same structure as the example illustrated in FIG. 14. Also in the this example, it is possible to suppress the expanding of the depletion layer in the edge termination structure portion 90 while preventing the characteristic variation of the active portion 160.

Figure 20:
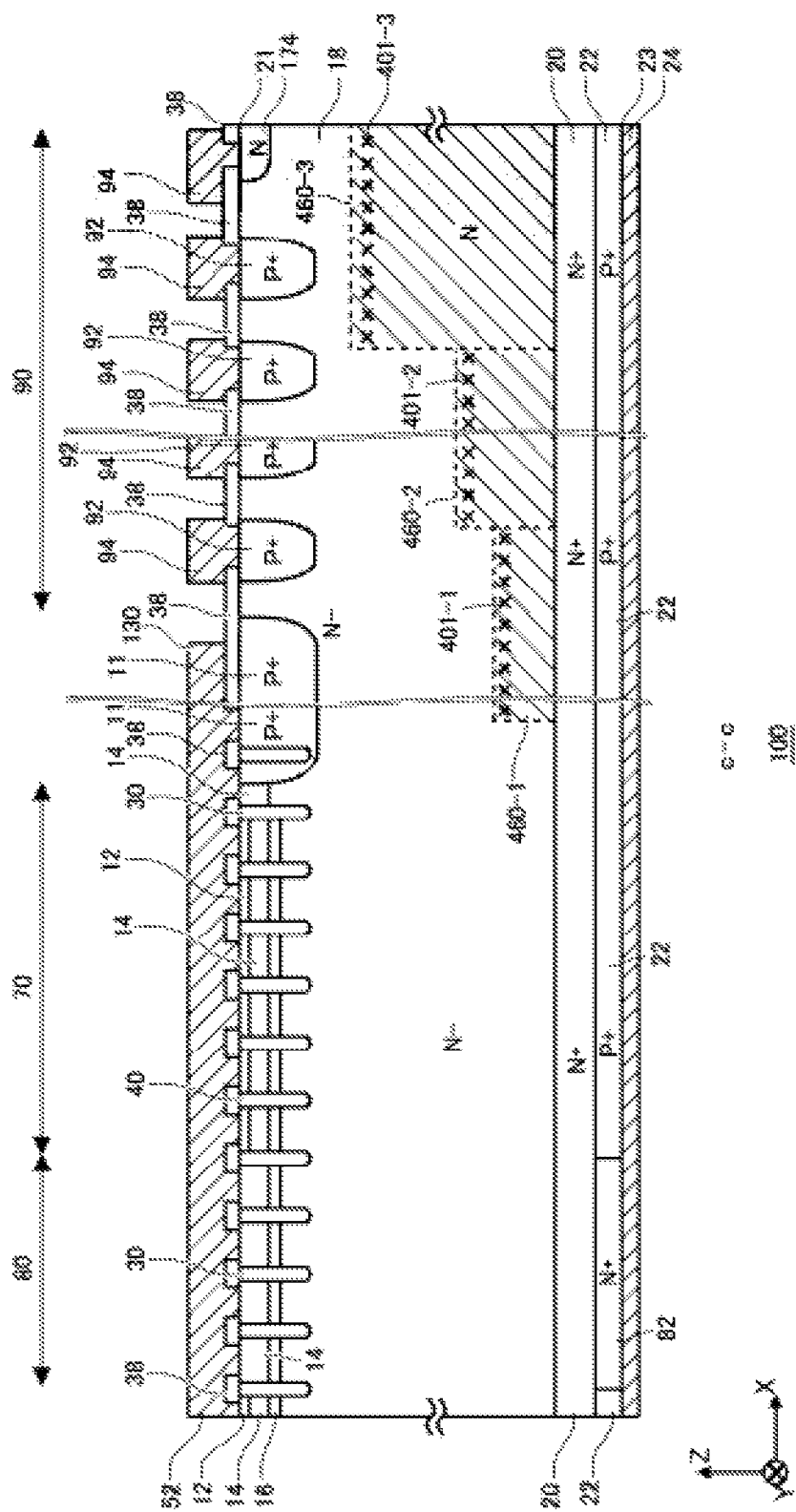
FIG. 20 illustrates a diagram showing another example of the cross section c-c in FIG. 8.

FIG. 20 illustrates a diagram showing another example of the cross section c-c in FIG. 8. The semiconductor device 100 of the this example is different from the semiconductor device 100 described in FIG. 16 to FIG. 19 in that the high concentration region 460 has a plurality of regions having different lengths in the Z axis direction. The position of the first peak 401 in the Z axis direction is also different in each region of the high concentration region 460. Other structures are the same as any of the examples described in FIG. 16 to FIG. 19.

The high concentration region 460 has an inner portion and an outer portion provided outside the inner portion. The outside refers to a side far from the active portion 160 in the XY plane. The outer portion has a larger length in the Z axis direction than the inner portion. In the example of FIG. 20, the high concentration region 460 includes a high concentration region 460-1, a high concentration region 460-2, and a high concentration region 460-3. The high concentration region 460-2 is arranged outside the high concentration region 460-1 and is provided longer than the high concentration region 460-1 in the Z axis direction. The high concentration region 460-3 is arranged outside the high concentration region 460-2 and is provided longer than the high concentration region 460-2 in the Z axis direction. That is, if the high concentration region 460-1 is an inner portion, the high concentration region 460-2 and the high concentration region 460-3 are outer portions. If the high concentration region 460-2 is an inner portion, the high concentration region 460-3 is an outer portion. In the this example, the length of each region of the high concentration region 460 in the Z axis direction varies stepwise.

An upper end of each high concentration region 460 may be arranged in the drift region 19. In another example, the upper end of the high concentration region 460-3 may be arranged at a position overlapping the guard ring 92 or the well region 11.

A first peak 401-2 included in the high concentration region 460-2 is provided at a position above a first peak 401-1 included in the high concentration region 460-1 in the Z axis direction. A first peak 401-3 included in the high concentration region 460-3 is provided at a position above the first peak 401-2 included in the high concentration region 460-2 in the Z axis direction.

According to the semiconductor device 100 of the this example, since the high concentration region 460 in the vicinity of the active portion 160 is short in the Z axis direction, the influence of the high concentration region 460 on the characteristics of the active portion 160 can be suppressed. In addition, since the high concentration region 460 away from the active portion 160 is long in the Z axis direction, the expanding of the depletion layer in the edge termination structure portion 90 can be suppressed.

Figure 21A:
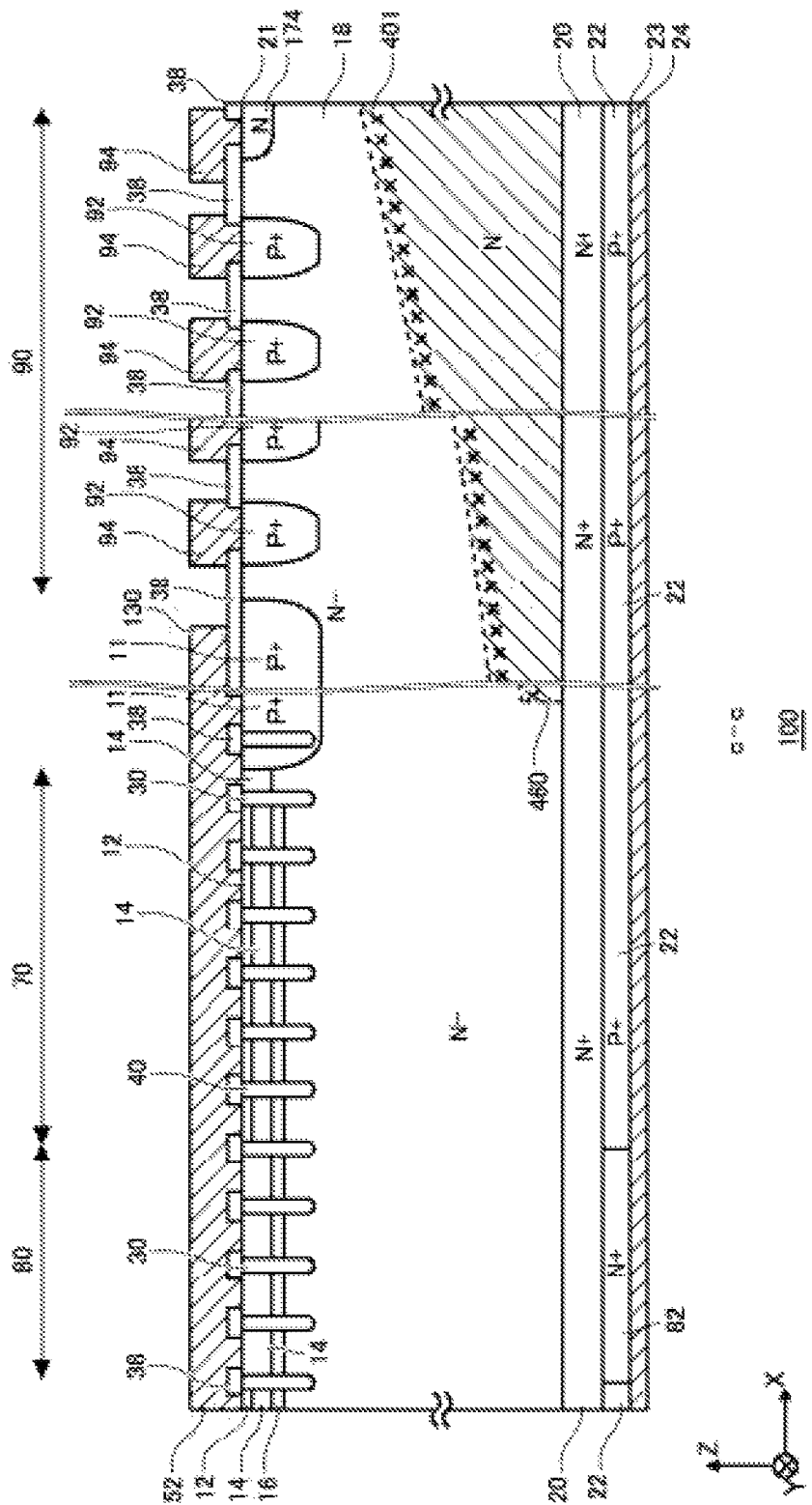
FIG. 21A illustrates a diagram showing another example of the cross section c-c in FIG. 8.

FIG. 21A illustrates a diagram showing another example of the cross section c-c in FIG. 8. The semiconductor device 100 of the this example is different from the semiconductor device 100 described in FIG. 16 to FIG. 19 in that the high concentration region 460 has a plurality of regions having different lengths in the Z axis direction. The position of the first peak 401 in the Z axis direction is also different in each region of the high concentration region 460. Other structures are the same as any of the examples described in FIG. 16 to FIG. 19.

The high concentration region 460 of the this example is different from the high concentration region 460 of FIG. 20 in that the length in the Z axis direction gradually increases as the distance from the active portion 160 increases. Other structures may be the same as in the example of FIG. 20. The first peak 401 of the this example is arranged on the upper side as it goes away from the active portion 160. Also in the this example, the entire upper end of the high concentration region 460 may be arranged in the drift region 19. In other examples, a portion of the upper end of the high concentration region 460 may be arranged at a position overlapping the guard ring 92 or the well region 11. Also in the this example, the influence of the high concentration region 460 on the characteristics of the active portion 160 can be suppressed. Further, the expanding of the depletion layer in the edge termination structure portion 90 can be suppressed.

Figure 21B:
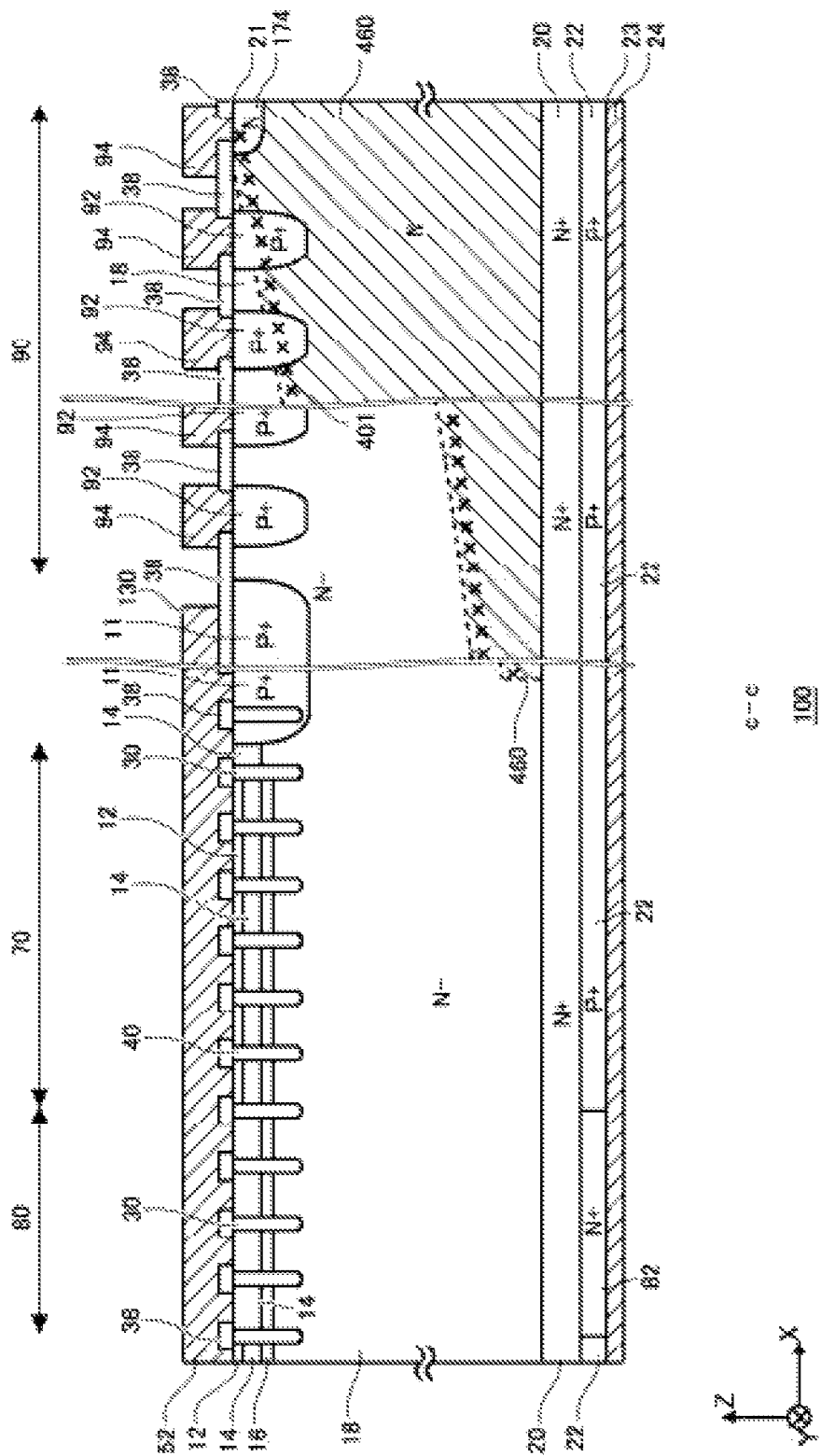
FIG. 21B illustrates a diagram showing another example of the cross section c-c in FIG. 8.

FIG. 21B illustrates a diagram showing another example of the cross section c-c in FIG. 8. In the semiconductor device 100 of the this example, the depth range in which the high concentration region 460 is provided and the position of the first peak 401 are different from those in the example of FIG. 21A. Other structures are the same as the example of FIG. 21A.

As in the example of FIG. 21A, the depth position of the first peak 401 is closer to the upper surface 21 with increasing distance from the active portion 160. Similarly, the depth position of the peak of the hydrogen chemical concentration is closer to the upper surface 21 with increasing distance from the active portion 160. A peak of the hydrogen chemical concentration may be provided at the position of the first peak 401. In the this example, the first peak 401 overlaps the channel stopper 174. The first peak 401 may also overlap one or more guard rings 92. In addition, in a region close to the side wall of the semiconductor substrate 10, hydrogen ions implanted from the lower surface 23 may penetrate the semiconductor substrate 10. The first peak 401 is not provided in the region through which the hydrogen ions penetrate. For example, in the channel stopper 174, the first peak 401 may not be provided in a region in contact with the side wall of the semiconductor substrate 10.

Also in the high concentration region 460, the length in the Z axis direction gradually increases as the high concentration region is away from the active portion 160. The high concentration region 460 of the this example is formed from the lower surface 23 to a position in contact with or overlapping the channel stopper 174. In a region below the channel stopper 174 of the this example, the high concentration region 460 is provided, and the bulk doping region 18 does not remain. Therefore, it is possible to suppress the depletion layer expanding in the X axis direction from extending to the outside of the channel stopper 174.

Figure 22:
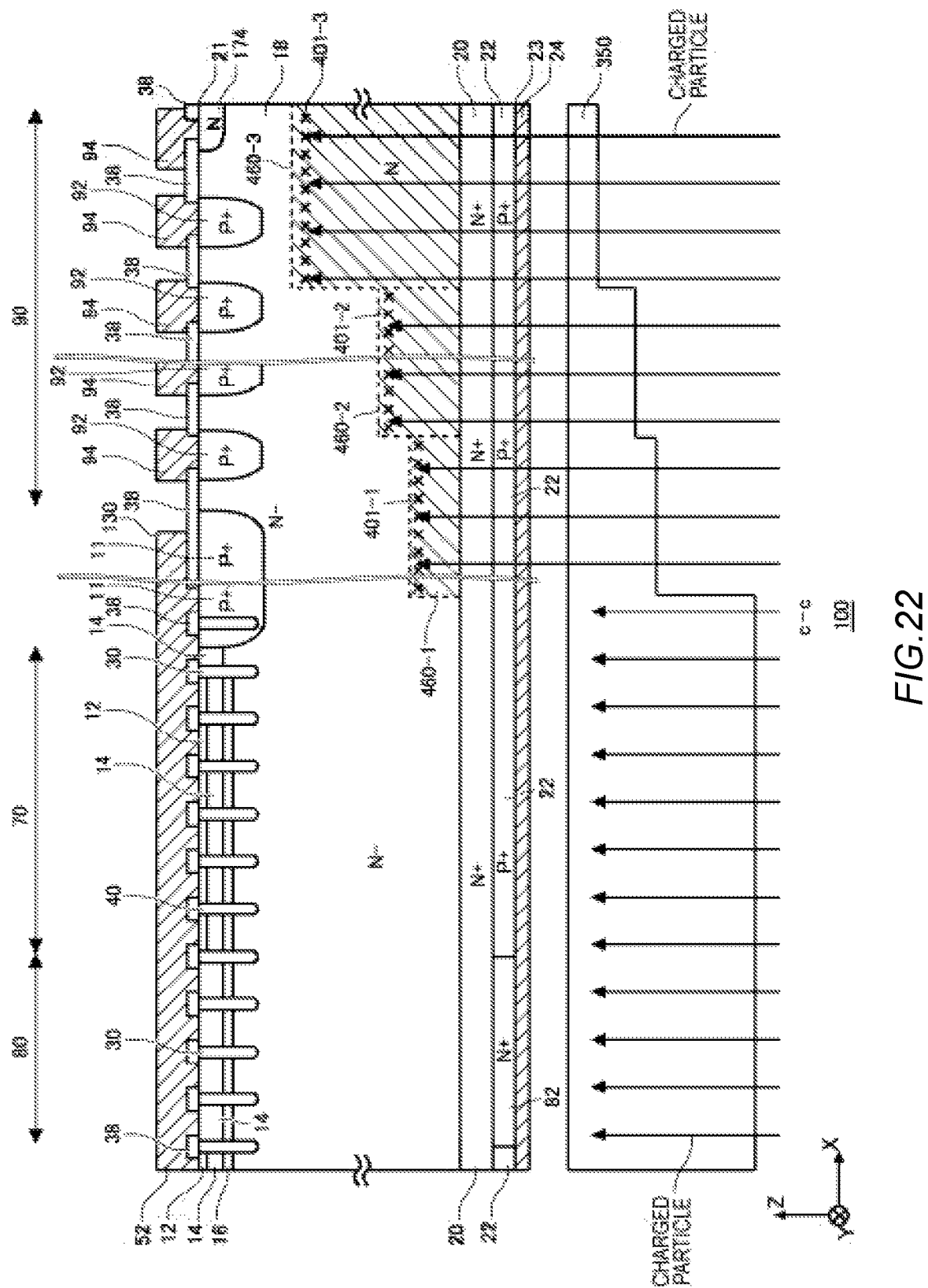
FIG. 22 illustrates a diagram showing an example of a method for forming a high concentration region 460 described in FIG. 20.

FIG. 22 illustrates a diagram showing an example of a method for forming the high concentration region 460 described in FIG. 20. In the this example, hydrogen ions are radiated from the lower surface 23 side while the shielding member 350 is arranged below the lower surface 23 of the semiconductor substrate 10. The shielding member 350 covers the entire active portion 160 and at least a part of the edge termination structure portion 90. The shielding member 350 covering the active portion 160 has a thickness that completely shields hydrogen ions and does not reach the semiconductor substrate 10.

The shielding member 350 covering the region where the high concentration region 460 is to be provided has a thickness corresponding to the length in the Z axis direction of each high concentration region 460. That is, the shielding member 350 is thinner in the region where the high concentration region 460 is formed longer. By thinning the shielding member 350, hydrogen ions reach deep in the semiconductor substrate 10, and the high concentration region 460 becomes long.

In the shielding member 350 of the this example, the shielding member 350 becomes thinner stepwise as the distance from the active portion 160 increases. The shielding member 350 may or may not be provided below the high concentration region 460-3. In FIG. 22, the collector electrode 24 is provided, but the lower surface 23 may be radiated with hydrogen ions before the collector electrode 24 is formed.

Figure 23:
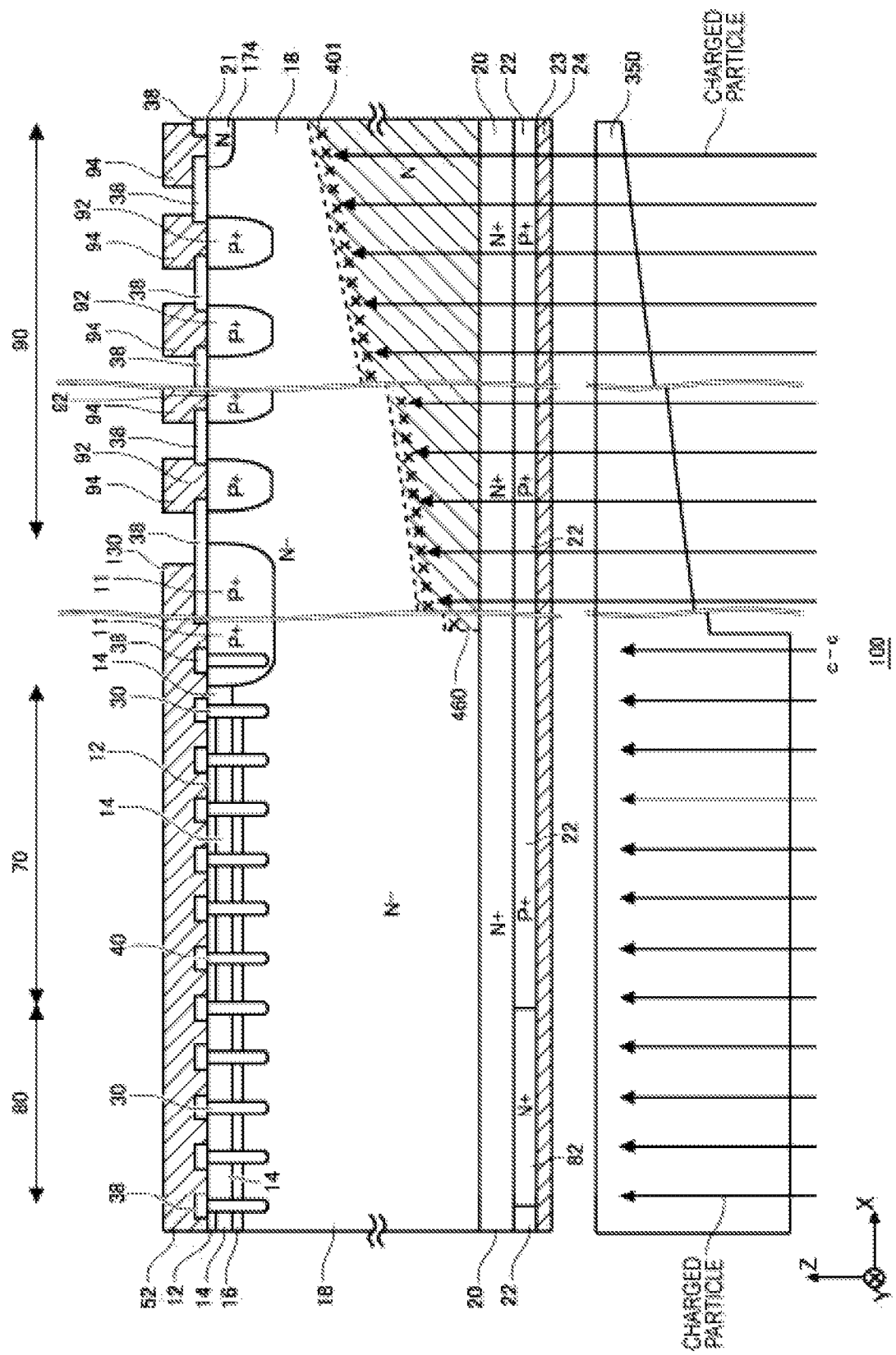
FIG. 23 illustrates a diagram showing an example of a method for forming the high concentration region 460 described in FIG. 21A.

FIG. 23 illustrates a diagram showing an example of a method for forming the high concentration region 460 described in FIG. 21A. In the this example, the shape of the shielding member 350 is different from that of the example of FIG. 22. Other conditions are the same as those in the example of FIG. 22.

In the shielding member 350 of the this example, the shielding member 350 becomes thinner linearly or curvilinearly as it goes away from the active portion 160. The shielding member 350 may or may not be provided below the high concentration region 460-3.

In the forms illustrated in FIG. 16 to FIG. 23, the specific resistance (resistivity) of the high concentration region 460 is lower than the specific resistance of the drift region 19 in the active portion 160 (the transistor portion 70 or the diode portion 80). The specific resistance of the high concentration region 460 may be 1/1.5 or less and 1/10 or more of the specific resistance of the drift region 19 of the active portion 160. The specific resistance of the high concentration region 460 may be ½ or less of the specific resistance of the drift region 19 of the active portion 160. As the specific resistance of each region, a central value in the Z axis direction of each region may be used, or an average value may be used.

In the forms illustrated in FIG. 16 to FIG. 23, the specific resistance of the drift region 19 of the active portion 160 may have a value according to the rated voltage of the semiconductor device 100. As an example, the specific resistance may be 20 to 80 Ωcm in a case where the rated voltage is 600 V, the specific resistance may be 40 to 120 Ωcm in a case where the rated voltage is 1200 V, the specific resistance may be 60 to 200 Ωcm in a case where the rated voltage is 1700 V, and the specific resistance may be 150 to 450 Ωcm in a case where the rated voltage is 3300 V.

In the forms illustrated in FIG. 1 to FIG. 23, the semiconductor substrate 10 may have bulk acceptors of the second conductivity type distributed throughout. The bulk acceptors, like bulk donors, are acceptors that are uniformly introduced into ingots during ingot manufacture. The bulk acceptors may be boron. The bulk acceptor concentration may be lower than the bulk donor concentration. That is, the ingot is an N type ingot. As an example, the bulk acceptor concentration is between $5\times10^{11}$ (/cm$^3$) and $9\times10^{13}$ (/cm$^3$), and the bulk donor concentration is between $5\times10^{12}$ (/cm$^3$) and $1\times10^{14}$ (/cm$^3$). The bulk acceptor concentration may be 1% or more, 10% or more, or 50% or more of the bulk donor concentration. The bulk acceptor concentration may be 99% or less, 95% or less, or 90% or less of the bulk donor concentration.

The existence of the bulk acceptor in the entire semiconductor substrate 10 makes it possible to reduce the net doping concentration in the semiconductor substrate 10 before hydrogen ions and the like are implanted. Therefore, the absolute value of the variation in the net doping concentration of the semiconductor substrate 10 can be reduced. Therefore, the specific resistance can be easily adjusted by the implantation of hydrogen ions.

The oxygen annealing described in FIG. 1 to FIG. 7 may be performed before the structures other than the bulk doping region 18 are formed among the structures described in FIG. 8 to FIG. 23. In another example, the oxygen annealing may be performed after forming each doping region inside the semiconductor substrate 10. In this case, the films such as the interlayer dielectric film 38 and the gate dielectric film 42 each may be formed after the oxygen annealing. Accordingly, deterioration of characteristics of the dielectric film and the like due to oxygen annealing can be suppressed.

Before oxygen annealing is performed, an N type dopant such as phosphorous may be implanted into the upper surface of the semiconductor substrate 10. The N type dopant may be selectively implanted in a top view or may be implanted over the entire surface. The N type dopant may be implanted in a region where the third high concentration region 203 is formed. After the N type dopant is implanted, the semiconductor substrate 10 is annealed at 1100° C. or more and 1300° C. or less for 20 hours or more in an oxygen atmosphere (first annealing). As a result, the N type dopant can be diffused to a relatively deep depth. The N type dopant may be diffused until it reaches the high concentration region 460. Thus, the donor concentration of the semiconductor substrate 10 can be adjusted over the entire depth direction. Note that oxygen having a concentration equal to the solid solubility limit is introduced into the semiconductor substrate 10 by the first annealing.

Next, the semiconductor substrate 10 is annealed at a temperature lower than that of the first annealing (second annealing). The second annealing may be performed in an oxygen atmosphere. The annealing time of the second annealing may be shorter than that of the first annealing. For example, the first annealing is performed at 900° C. or more and 1000° C. or less for 15 hours or less. As a result, oxygen in the semiconductor substrate 10 diffuses outward, and the upper surface side oxygen reduction region 450 is formed.

After the second annealing, the structures other than the third high concentration region 203 may be formed. The second annealing may be included in the step of forming the structure on the upper surface 21 side of the semiconductor substrate 10.

Note that the temperature of the first annealing may be 1000° C. or lower. In this case, it is possible to suppress oxygen from being introduced into the semiconductor substrate 10 in the first annealing.

While the description has been made using the embodiments of the present invention, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

It should be noted that the operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the operation flow is described using phrases such as "first" or "next" in the claims, specification, or drawings, it does not necessarily mean that the process must be performed in this order.

EXPLANATION OF REFERENCES

10: semiconductor substrate
11: well region
12: emitter region
14: base region
15: contact region
16: accumulation region
18: bulk doping region
19: drift region
20: buffer region
21: upper surface
22: collector region
23: lower surface
24: collector electrode
29: linear portion
30: dummy trench portion
31: edge portion
32: dummy dielectric film
34: dummy conductive portion
38: interlayer dielectric film
39: linear portion
40: gate trench portion
41: edge portion
42: gate dielectric film
44: gate conductive portion
52: emitter electrode
54: contact hole
60, 61: mesa portion
70: transistor portion
80: diode portion
81: extension region
82: cathode region
90: edge termination structure portion
91: region
92: guard ring
94: field plate
100: semiconductor device
102: end side
106: pass-through region
112: gate pad
130: outer circumferential gate runner
131: active-side gate runner
160: active portion
174: channel stopper
202: second high concentration region
203: third high concentration region
313: flat portion
314: peak
318: phosphorous concentration peak
323: flat portion
350: shielding member
401: first peak
402: second peak
403: third peak
404: fourth peak
405: oxygen concentration peak
406: recombination center peak
407: donor concentration peak
408: peak
411, 412, 413, 414: upper tail
421, 422, 423, 424: lower tail
425: fifth peak
426: sixth peak
435, 436: upper tail
445, 446: lower tail
450: upper surface side oxygen reduction region
452: maximum value region
454: lower surface side oxygen reduction region
460: high concentration region

What is claimed is:

1. A semiconductor device comprising:
a semiconductor substrate that has an upper surface and a lower surface and throughout which a bulk donor of a first conductivity type is distributed;
a high concentration region of a first conductivity type that includes a center position in a depth direction of the semiconductor substrate and has a donor concentration higher than a doping concentration of the bulk donors; and
an upper surface side oxygen reduction region that is provided in contact with the upper surface of the semiconductor substrate inside the semiconductor substrate and in which an oxygen chemical concentration decreases as approaching the upper surface of the semiconductor substrate.

2. The semiconductor device according to claim 1, wherein
a first peak at which a distribution of an impurity chemical concentration becomes a peak is arranged in an end portion in the depth direction of the high concentration region.

3. The semiconductor device according to claim 2, wherein
an oxygen chemical concentration distribution in the depth direction of the semiconductor substrate includes a position where the oxygen chemical concentration becomes a maximum value and has a maximum value region where the oxygen chemical concentration is 50% or more of the maximum value, and
the first peak is arranged in the maximum value region or on the upper surface side of the semiconductor substrate with respect to the maximum value region.

4. The semiconductor device according to claim 2, wherein the distribution of the impurity chemical concentration in the depth direction includes a lower tail extending from the first peak toward the lower surface, and an upper tail in which the impurity chemical concentration more steeply decreases than the lower tail from the first peak toward the upper surface.

5. The semiconductor device according to claim 2, wherein
the high concentration region is provided from the first peak to the lower surface of the semiconductor substrate.

6. The semiconductor device according to claim 3, wherein
the oxygen chemical concentration distribution has an oxygen concentration peak at which the oxygen chemical concentration exhibits a local maximum value.

7. The semiconductor device according to claim 2, comprising a second peak of a hydrogen chemical concentration, arranged between the first peak and the lower surface.

8. The semiconductor device according to claim 7, further comprising a lower surface side oxygen reduction region that is arranged on the lower surface side with respect to the upper surface side oxygen reduction region and in which an oxygen chemical concentration decreases as approaching the lower surface of the semiconductor substrate, wherein
the second peak of the hydrogen chemical concentration is arranged in the lower surface side oxygen reduction region.

9. The semiconductor device according to claim 7, wherein
the second peak of the hydrogen chemical concentration is arranged in the maximum value region.

10. The semiconductor device according to claim 7, further comprising:
a drift region of a first conductivity type provided in the semiconductor substrate; and
a buffer region that is arranged between the drift region and the lower surface and has a higher doping concentration than the drift region, wherein
the second peak of the hydrogen chemical concentration is arranged in the buffer region.

11. The semiconductor device according to claim 1, wherein
a recombination center concentration distribution in the depth direction of the semiconductor substrate has a recombination concentration peak, and
the recombination concentration peak is arranged in a region where the oxygen chemical concentration is 70% or more of the maximum value.

12. The semiconductor device according to claim 2, wherein
the first peak is arranged in a region where the oxygen chemical concentration is 70% or more of the maximum value.

13. The semiconductor device according to claim 2, wherein
the impurity chemical concentration is a hydrogen chemical concentration.

14. The semiconductor device according to claim 1, wherein
the bulk donor is phosphorous or antimony.

15. The semiconductor device according to claim 1, wherein
a bulk acceptor of a second conductivity type is distributed throughout the semiconductor substrate.

16. The semiconductor device according to claim 15, wherein
the bulk acceptor is boron.

17. The semiconductor device according to claim 1, further comprising:
one or more guard rings that are in contact with an upper surface of the semiconductor substrate and have a second conductivity type; and
a channel stopper of a first conductivity type or a second conductivity type which is provided further outside an outermost guard ring, is in contact with the upper surface of the semiconductor substrate, and have a doping concentration higher than that of the bulk donor, wherein
the channel stopper contains hydrogen.

18. The semiconductor device according to claim 17, wherein
hydrogen is distributed from a lower surface of the semiconductor substrate to the channel stopper.

19. The semiconductor device according to claim 17, wherein
a peak of a hydrogen chemical concentration is provided in the channel stopper.

20. The semiconductor device according to claim 1, wherein
the high concentration region is provided up to the lower surface of the semiconductor substrate.

21. The semiconductor device according to claim 20, wherein
the high concentration region is provided up to a position not in contact with the upper surface of the semiconductor substrate.

22. The semiconductor device according to claim 20, wherein
the high concentration region is provided up to a position overlapping the upper surface side oxygen reduction region.

23. The semiconductor device according to claim 20, wherein
the high concentration region is provided up to the upper surface of the semiconductor substrate.

24. The semiconductor device according to claim 1, wherein
an oxygen chemical concentration distribution in the depth direction of the semiconductor substrate includes a position where the oxygen chemical concentration becomes a maximum value and has a maximum value region where the oxygen chemical concentration is 50% or more of the maximum value, and
the maximum value region and the high concentration region are provided to be overlapped in a partial region in a depth direction of the semiconductor substrate.

25. The semiconductor device according to claim 1, wherein
an emitter region of a first conductivity type is arranged in the upper surface of the semiconductor substrate.

* * * * *